(12) United States Patent
Singh et al.

(10) Patent No.: US 9,297,836 B2
(45) Date of Patent: Mar. 29, 2016

(54) METHOD AND SENSOR FOR SENSING CURRENT IN A CONDUCTOR

(71) Applicant: Deere & Company, Moline, IL (US)

(72) Inventors: Brij N Singh, West Fargo, ND (US);
Neal D Clements, Fargo, ND (US);
Aron Fisk, Fargo, ND (US); Andrew D Wieland, Fargo, ND (US)

(73) Assignee: DEERE & COMPANY, Moline, IL (US)

(*) Notice: Subject to any disclaimer, the term of this patent is extended or adjusted under 35 U.S.C. 154(b) by 446 days.

(21) Appl. No.: 13/930,940

(22) Filed: Jun. 28, 2013

(65) Prior Publication Data
US 2014/0253109 A1     Sep. 11, 2014

Related U.S. Application Data

(63) Continuation-in-part of application No. 13/790,835, filed on Mar. 8, 2013.

(51) Int. Cl.
| G01N 27/72 | (2006.01) |
| G01R 15/20 | (2006.01) |
| G01R 15/18 | (2006.01) |
| G01R 31/42 | (2006.01) |
| G01R 19/00 | (2006.01) |

(52) U.S. Cl.
CPC ............... *G01R 15/20* (2013.01); *G01R 15/181* (2013.01); *G01R 19/0007* (2013.01); *G01R 31/42* (2013.01)

(58) Field of Classification Search
CPC ...... G01R 15/20; G01R 15/181; G01R 31/42; G01R 19/0007

USPC ................................. 324/227, 522, 179, 260
See application file for complete search history.

(56) References Cited

U.S. PATENT DOCUMENTS

| 3,394,288 A |   | 7/1968 | Dadok |
| 5,296,802 A | * | 3/1994 | Beranger ............. G01R 15/148 324/117 R |

(Continued)

FOREIGN PATENT DOCUMENTS

WO   2010082115 A1   7/2010

OTHER PUBLICATIONS

International Search Report and the Written Opinion of the International Searching Authority, dated Apr. 23, 2014 (10 pages).

(Continued)

*Primary Examiner* — Tung X Nguyen
*Assistant Examiner* — Thang Le

(57) ABSTRACT

A sensor comprises primary ferrite members spaced apart from the magnetic field sensor on opposite sides of the magnetic field sensor concentrate or steer an orientation of a magnetic field of the observed signal toward a target area of the magnetic field sensor. A magnetic field sensor senses a direct current signal component or lower frequency component of the observed signal. A first filtering circuit has a high-pass filter response. The first filtering circuit is coupled to the inductor to provide a filtered alternating current signal component. A second filtering circuit has a low-pass filter response. The second filtering circuit coupled to the magnetic field sensor to provide a filtered direct current signal component. A sensor fusion circuit determines an aggregate sensed current based on the filtered alternating current signal component and the filtered direct current signal component.

24 Claims, 18 Drawing Sheets

(56) References Cited

U.S. PATENT DOCUMENTS

| | | |
|---|---|---|
| 5,615,075 A | 3/1997 | Kim |
| 5,796,224 A | 8/1998 | Hayashi et al. |
| 6,366,076 B1 * | 4/2002 | Karrer .................. G01R 15/181 324/117 R |
| 6,426,617 B1 | 7/2002 | Haensgen et al. |
| 6,564,084 B2 | 5/2003 | Allred, III et al. |
| 7,218,095 B2 | 5/2007 | Hill |
| 7,274,186 B2 | 9/2007 | Yakymyshyn et al. |
| 7,714,594 B2 | 5/2010 | Ibuki et al. |
| 8,258,777 B2 | 9/2012 | Chen |
| 2002/0149355 A1 * | 10/2002 | Sandquist ............ G01R 15/205 324/117 H |
| 2004/0201373 A1 * | 10/2004 | Kato .................... G01R 15/185 324/117 R |
| 2007/0257663 A1 * | 11/2007 | Mende ................ G01R 15/185 324/130 |
| 2013/0027021 A1 * | 1/2013 | Gokhale ............ G01R 19/0015 324/117 R |

OTHER PUBLICATIONS

International Search Report and the Written Opinion of the International Searching Authority, dated Apr. 29, 2014 (11 pages).

* cited by examiner

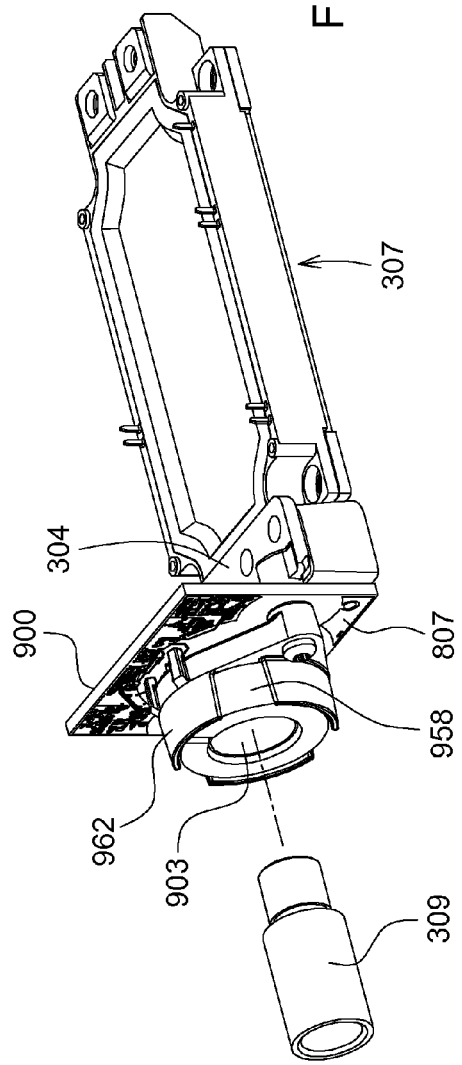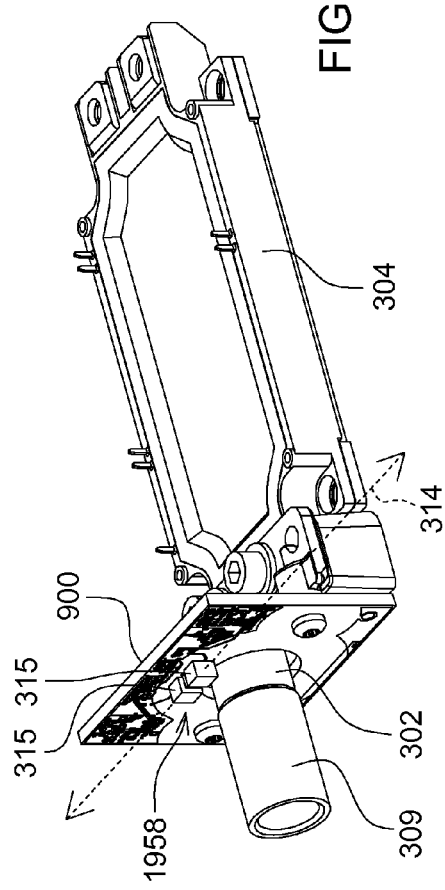

METHOD AND SENSOR FOR SENSING CURRENT IN A CONDUCTOR

RELATED APPLICATIONS

This document is a continuation in part of U.S. application Ser. No. 13/790,835, filed Mar. 8, 2013 and claims priority based on the earlier filed application, which is hereby incorporated by reference into this document.

FIELD OF THE DISCLOSURE

This disclosure relates to a method and sensor for sensing current in a conductor.

BACKGROUND

Vehicles, equipment or machinery may use electric motors that are controlled by inverters or motor controllers. A prior art sensor may measure current in one or more input conductors, such as wires or cables, that feed an electric motor from the inverter. More generally, a prior art sensor may measure current in one or more conductors associated with any power electronics device that uses power semiconductors, such as insulated gate, bipolar transistors (IGBT) or metal-oxide semiconductor field-effect transistors (MOSFET).

Certain prior art sensors for sensing current in a conductor associated with an electric motor may fail prematurely because they have poor resistance to thermal stress. In some prior art sensors, self-heating of a ferromagnetic core, from induced eddy currents and hysteresis losses, can promote failure of a thermally sensitive device, such as Hall effect magnetic field sensor embedded within core, or an inductive coil used with the core. Other prior art sensors for sensing current in the conductor may occupy a larger than desired volume because the maximum circuit density can be limited, while effectively addressing thermal stress. Still other prior art sensors may not respond appropriately for rapid changes in current; hence, fail to respond for a sudden short circuit at an inverter output. Thus, there is a need for a compact sensor for sensing current that is resistant to failures or reduced longevity associated with thermal stresses or associated with inaccurate sensing of rapid changes in current.

SUMMARY

In accordance with one embodiment, primary ferrite members spaced apart from the magnetic field sensor on opposite sides of the magnetic field sensor concentrate or steer an orientation of a magnetic field of the observed signal toward a target area of the magnetic field sensor. A magnetic field sensor senses at least a direct current signal component or a lower frequency alternating current component of the observed signal with the concentrated magnetic field sensor. A first filtering circuit has a high-pass filter response. The first filtering circuit is coupled to an inductor to provide a filtered alternating current signal component (e.g., higher frequency component). A second filtering circuit has a low-pass filter response. The second filtering circuit is coupled to the magnetic field sensor to provide at least a filtered direct current signal component (e.g., or a lower frequency component and a direct current component, where the lower frequency component is lower than a higher frequency component). A sensor fusion circuit determines an aggregate sensed current based on the filtered alternating current signal component and the filtered direct current signal component.

BRIEF DESCRIPTION OF THE DRAWINGS

FIG. 11 through FIG. 13, inclusive, show perspective views of one embodiment of the current sensor incorporated into an electric assembly that forms part of an inverter or motor controller.

FIG. 14 shows a perspective view of another embodiment of the current sensor incorporated into an electric assembly.

DESCRIPTION OF ILLUSTRATIVE EMBODIMENT(S)

Figure 1:
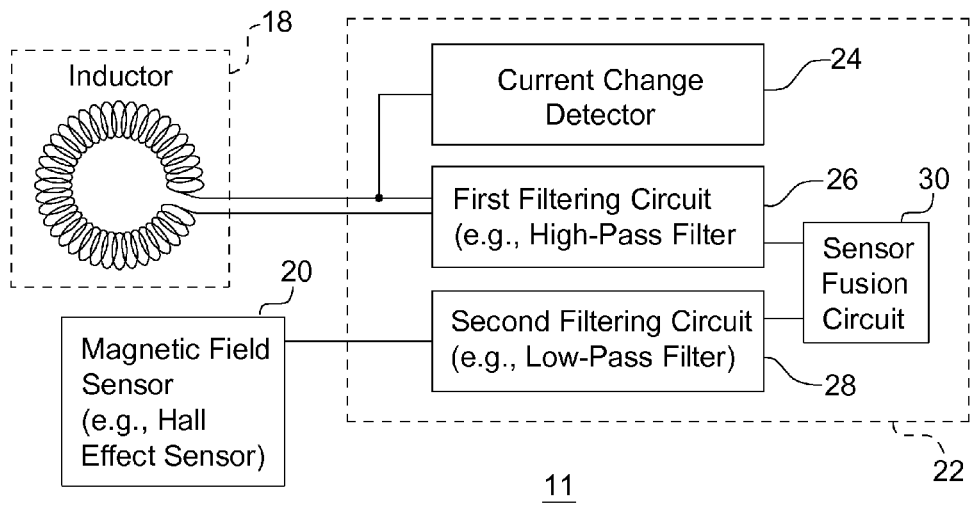
FIG. 1 is a block diagram of a first embodiment of the current sensor for sensing current in a conductor.

In accordance with one embodiment, FIG. 1 illustrates a current sensor 11. As illustrated, the current sensor 11 comprises an inductor 18 for sensing an alternating current signal component (or first alternating signal component) of an observed signal in a conductor 16 (e.g., 16 in FIG. 3). In general, the conductor 16 may comprise a conductor 16 between a source and electrical load. For example, the conductor 16 may comprise a conductor 16 (e.g., wire, cable or bus bar) between an output terminal of an inverter 10 or controller and an input terminal of an electric motor 14.

Alternatively, the conductor 16 could be any conductor, conductive trace, wire, a set of wires, a wire bond or set of wire bonds associated with one or more respective output terminals of corresponding power semiconductor devices (e.g., an insulated-gate, bipolar transistors (IGBT's) or a metal-oxide semiconductor field-effect transistors (MOSFET's)), where the current sensor 11 is configured to sense current flowing within a power electronics module, an electric machine controller, a power output stage, or an inverter (e.g., an inverter housing) from the one or more output terminals to an electric motor, electric machine, or other load connected to the output terminal.

The inductor 18 senses or receives an induced alternating current signal from the conductor 16. For example, the inductor senses or receives a first alternating current signal component (e.g., higher frequency alternating signal component) from the conductor. In one embodiment, the inductor 18 comprises a substrate 900 (e.g., FIG. 6-FIG. 9), conductive traces associated with different layers of the substrate, and one or more conductive vias (e.g., buried vias) for interconnecting the plurality of conductive traces. As used herein, a buried via is a conductive via that is connected to neither outer layer of the multi-layered substrate or multi-layered circuit board. Instead, a buried via connects only between inner layers, or the conductive traces of inner layers, of the multi-layered substrate or circuit board.

Here, in FIG. 1 magnetic field sensor 20 senses at least a direct current signal component of the observed signal in the conductor 16.

Alternately, the magnetic field sensor 20 senses a direct current signal component and a lower frequency signal component (or second alternating signal component) of the alternating current signal in the conductor 16. The second alternating signal component is lower in frequency than the first alternating signal component.

The current sensor 11 comprises circuitry 22 or low voltage electronics. For example, the circuitry 22 has a first filtering circuit 26 and a second filtering circuit 28 that are coupled to a sensor fusion circuit 30. As illustrated, the circuitry 22 further comprises a current change detector 24 that is capable of receiving an alternating current signal from the inductor 18.

A first filtering circuit 26 has a high-pass filter response. The first filtering circuit 26 is coupled to the inductor 18 to provide a filtered alternating current signal component (e.g., first alternating signal component). A second filtering circuit 28 has a low-pass filter response. The second filtering circuit 28 coupled to the magnetic field sensor 20 to provide: (1) a filtered direct current signal component, (2) a lower frequency alternating signal component (e.g., second alternating signal component), or both.

In one embodiment, a sensor fusion circuit 30 determines an aggregate sensed current based on the filtered alternating current signal component and the filtered direct current signal component. The aggregate sensed current refers to the combined current that includes contributions of the direct current signal components and alternating signal components.

For inverter control applications sensor needs to accurately sense current and provide time varying current to controller. However, the sensed current (e.g., from the inductor 18, the magnetic field sensor 20, or both) could also be converted into root mean squared (RMS) signal for diagnosis using any known or commercially available technique (e.g., an I-squared T algorithm). Under one illustrative model of an I squared T algorithm, the continuous maximum power that a motor can dissipate without exceeding its temperature rating is defined by the following equation: $P_{max}=I_{rms}^2*R_LT$ where $P_{max}$ is the continuous maximum power that a motor can dissipate without exceeding it temperature rating, $I_{rms}$ is the root mean squared current in the windings of the motor, and T is the elapsed time or time duration. For example, data processor (e.g., 54 in FIG. 2) may be programmed to active or deactivate a switch to turn-off an inverter or electrical energy supply to the load or motor if the continuous maximum power is exceeded for a triggering duration.

In a first illustrative example of an alternate embodiment, the sensor fusion circuit 30 not only produces time-varying current signal but may also determines aggregate sensed current by converting the alternating signal components into root mean squared values, or values derived from root mean squared values, for addition to the direct signal component. In a second illustrative example of an alternate embodiment, the sensor fusion circuit 30 may also determine aggregate sensed current by converting the alternating signal components into root mean squared values, or values derived from root mean squared values, for addition to the direct signal component, where the root mean squared component and the direct signal component are assigned weights or scaling factors.

In one embodiment, the sensor fusion circuit 30 scales a first gain of the filtered alternating signal component and a second gain of the filtered direct current signal component to obtain a conversion factor between actual current of the observed signal flowing through a conductor 16 and the aggregate sensed current.

In one embodiment, a current change detector 24 is coupled to the inductor 18. A current change detector 24 comprises a measurement circuit for determining a change in current versus time for the alternating signal component of the observed signal by inductor 18. The observed signal is related to the current flowing in conductor 16, which induces the observed signal in inductor 18. For example, current change detector 24 may comprise a differentiating circuit. The current change detector 24 may be capable of detecting transient short-circuit conditions, for example.

In one embodiment, the magnetic field sensor 20 comprises a Hall Effect sensor. In one configuration, the magnetic field sensor 20 is associated with a ferrite structure to attenuate stray electromagnetic signals (e.g., alternating current) that might otherwise result in distortions or inaccuracies in the measurement of the direct current component, the low frequency alternating signal component, or both.

In one configuration, the inductor 18 comprises a time-varying flux sensor (TVFS) coil and the magnetic field sensor 20 comprises a Hall Effect sensor. Here, the inductor 18 does not need to use a ferromagnetic core; hence, is not susceptible to thermal heating from eddy currents or induced currents than can arise in a ferromagnetic core. The time-varying flux sensor (TVFS) coil and Hall element sense or detect observed current flowing through the conductor 16 (e.g., conductor 16) that is between a source and load, such as an inverter 10 and an electric motor 14, respectively. The inductor 18 (e.g., TVFS coil) is used for time-varying current or an alternating current signal component, while the magnetic field sensor 20 (e.g., Hall Effect sensor) is used for a direct current (DC)

signal component and any lower frequency time-varying current component or any lower frequency alternating current signal component.

The inductor 18 (e.g., TVFS coil) feeds sensed first signal ($v_{TVFS}$) to the first filtering circuit 26, which has a high pass filtering response to attenuate low frequency signals. The magnetic field sensor 20 (e.g., Hall Effect) sensor feeds a second sensed signal ($v_{Hall}$) to the second filtering circuit 28, which has a low pass frequency response to attenuate high frequency signals. The respective cut-off frequencies and frequency responses of the first filtering circuit 26 and the second filtering circuit 28 are critical for the performance of the current sensor 11. In one illustrative example, the aggregate frequency response of the first filtering circuit 26 and the second filtering circuit 28 is designed to ensure that the combined or aggregate frequency response of the current sensor has a constant gain from approximately 0 Hz to a frequency at or beyond 1 kHz (approximately) and doesn't offer any material phase shift between any of two input signals (e.g., first sensed signal and second sensed signal, or $v_{TVFS}$ and $v_{Hall}$) and the output signal ($i_{sensed}$) at the output of the sensor fusion circuit 30. Advantageously, the cut-off frequencies of first filtering circuit 26 and the second filtering circuit 28 can be selectively altered (e.g., via selection of capacitances or resistances (e.g., illustrated in FIG. 5) for any tuned circuits) for the current sensor (11 in FIG. 1 or 111 in FIG. 2) to support a wide variety of inverter driven electric machines (e.g., electric motors or generators), such as sinusoidal and non-sinusoidal electric drives as over a considerable range of input operating frequencies and waveforms.

The sensor fusion circuit 30 cooperates with the first filtering circuit 26 and the second filtering circuit 28 to avoid any material phase shift between the two signals, filtered first signal and the filtered second signal, that are inputted to the sensor fusion circuit 30 from the first filtering circuit 26 and the second filtering circuit 28, respectively. The sensor fusion circuit 30 can adjust the gain of magnitude of the filtered first signal provided by the first filtering circuit 26 and the filtered second signal provided by the second filtering circuit 28 to scale the relative contributions of the filtered first signal and the filtered second signal to the output signal ($i_{sensed}$). The sensor fusion circuit 30 combines the filtered first signal and the filtered second signal, which can be outputs of high-pass circuit for TVFS coil and low-pass circuit for Hall Effect sensor. The sensor fusion circuit 30 adjusts the gain of the filtered first signal and the filtered second signal to scale properly the relative contributions of the first signal and second signal to get a conversion factor between current flowing through bus bar and output signal, $i_{sensed}$. Therefore, sensor output ($i_{sensed}$) is a voltage signal with a conversion factor expressed as milli-Volts per Ampere (mV/A).

In one embodiment, the current change detector 24 provides measurement for change in current versus time (di/dt) rating of current flowing through the conductor 16 (e.g., bus bar).

Figure 2:
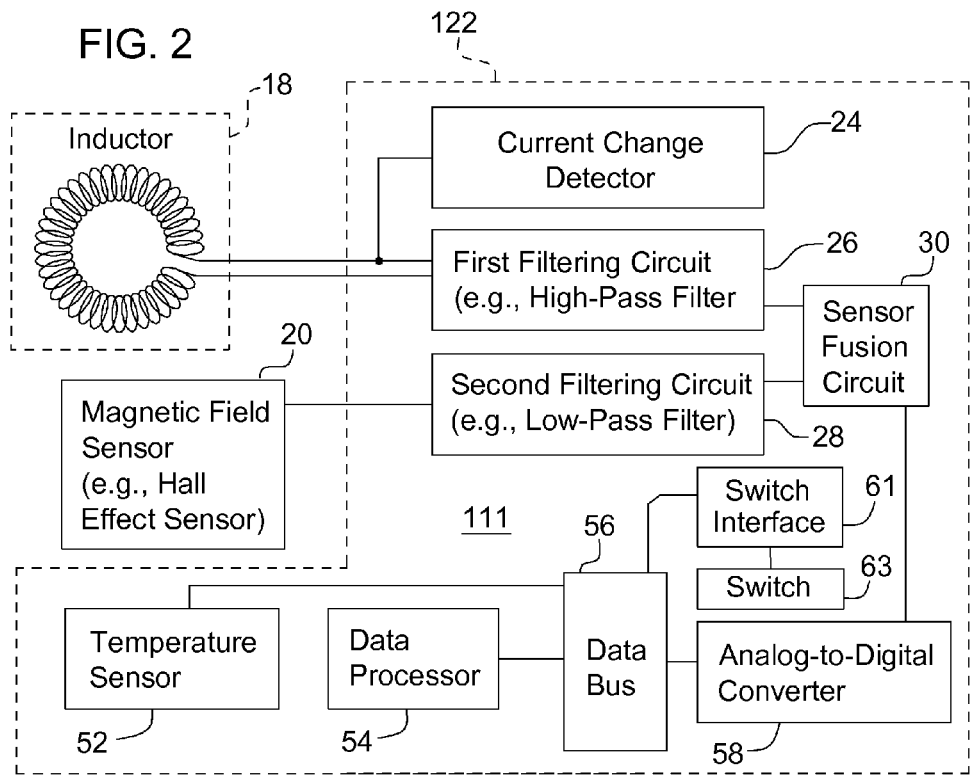
FIG. 2 is a block diagram of a second embodiment of the current sensor for sensing current in a conductor.

The current sensor 111 of FIG. 2 is similar to the current sensor 11 of FIG. 1, except the current sensor of FIG. 2 further comprises a temperature sensor 52, a data processor 54, a data bus 56, an analog-to-digital converter 58. Further the current sensor 111 may comprise an optional switch interface 61 coupled to the data bus, a switch 63 coupled to the switch interface 61, where the switch 61 is a series supply line (e.g., conductor 16) to an inverter or a power supply to an inverter (e.g., 10) or controller. Like reference numbers in FIG. 1 and FIG. 2 indicate like elements.

The current sensor 111 comprises circuitry 122 or low voltage electronics. For example, the circuitry 122 has a first filtering circuit 26 and a second filtering circuit 28 that are coupled to a sensor fusion circuit 30. As illustrated, the circuitry 122 further comprises a current change detector 24 that is capable of receiving an alternating current signal from the inductor 18. In the circuitry 122, a temperature sensor 52, an electronic data processor 54, and an analog-to-digital converter 58 are coupled to a data bus 56.

In FIG. 2, the analog-to-digital converter 58 is coupled to the sensor fusion circuit 30 or the current sensor 111. In turn the analog-to-digital converter 58 is coupled to the data bus 56. The analog-to-digital converter 58 may change the analog aggregate sensed current at the output of the sensor fusion circuit 30 to a digital aggregate sensed current. The data processor 54 can evaluate or process the digital aggregate sensed current to facilitate control, diagnostics, or status of the inverter 10. In certain embodiments, the data processor 54 and data bus 56 may be incorporated into the inverter (e.g., 10).

The temperature sensor 52 and the data processor 54 can communicate via the data bus 56. Similarly, the data processor 54 and the switch interface 61 (e.g., switch driver) can communicate via the data bus 56. The switch interface 61 is coupled to a switch 63 that can interrupt the flow of electrical energy from a power supply to the inverter 10, or otherwise deactivate one or more phases of the inverter.

In one embodiment, the temperature sensor 52 comprises a circuit for estimating a temperature of a conductor 16 or bus bar between the output terminal of an inverter 10 and the input terminal of an electric motor 14. For example, the temperature sensor 52 may comprise a thermistor, an infra-red sensor, or another device that provides an electrical signal or data message that corresponds to a sensed temperature. A thermistor may provide a change in resistance associated with a change in the sensed temperature of the conductor 16.

In one configuration, the temperature sensor 52 provides a digital output. Alternately, if the temperature sensor 52 provides an analog output, an analog-to-digital converter 58 may be used to interface with the data bus 56. The sensed temperature data or message from the temperature sensor 52 is provided to or accessible to the data processor 54. The data processor 54 may use the sensed temperature data to deactivate or turn-off switch 61 power switches (e.g., power semiconductors) within inverter 10 to prevent any thermal damage to the inverter 10 and/or motor.

Figure 3:
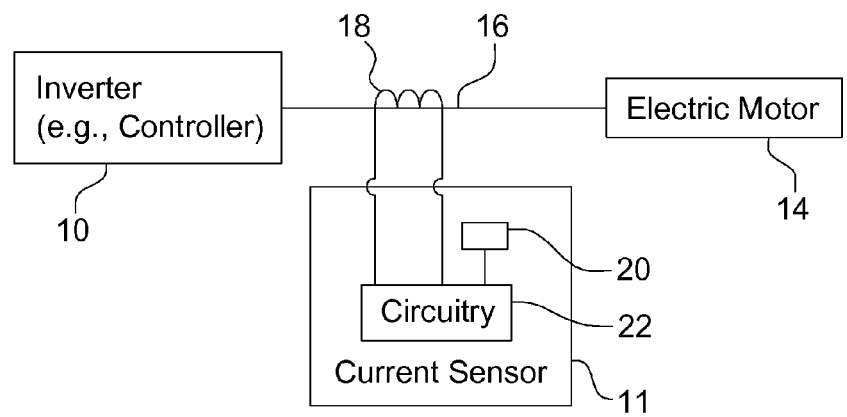
FIG. 3 is a block diagram that illustrates how the current sensor can be applied to measure the current associated with an input conductor to an electric motor.

As illustrated in FIG. 3, the inductor 18 and the magnetic field sensor 20 are arranged to be proximate or near a conductor 16 that connects an output terminal of an inverter 10 to an input terminal of an electric motor 14. For example, the inductor 18 and the multilayered substrate may have an opening such that the conductor 16 with the current to be observed is surrounded, partially or completely, by the inductor 18 to maximize or facilitate inductive coupling of current between the conductor 16 and the inductor 18. In one embodiment, the conductor 16 comprises a bus bar between an inverter 10 or motor controller and electric motor 14.

The current sensor of FIG. 1 or FIG. 2 may be applied to the detect current in a conductor 16 that supplies electrical energy (e.g., via one or more phases of alternating current signals) to an electric motor 14. A current change detector 24 determines a change in current versus time for the alternating signal component. A temperature estimator estimates a temperature of the conductor 16.

In one embodiment, the electric motor 14 requires only an alternating current input signal, such that if a direct current input signal is detected it may indicate that the inverter 10 is not functioning properly for one or more output phases.

Figure 4:
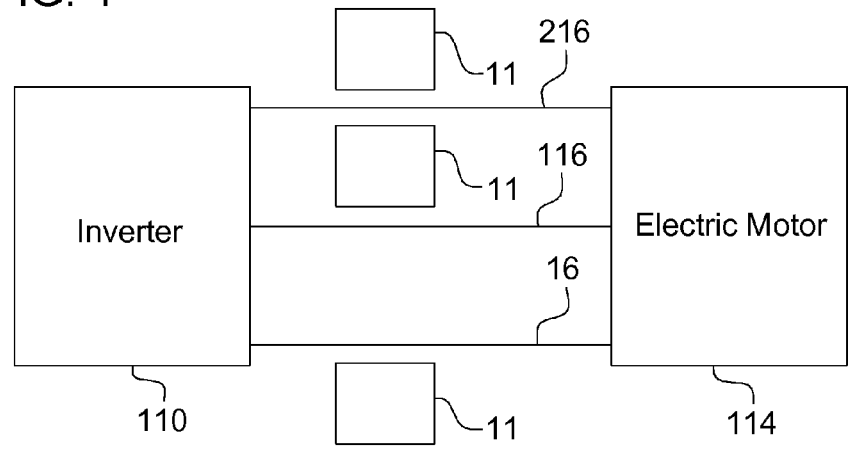
FIG. 4 is a block diagram that illustrates how multiple current sensors can be used to measure various electrical currents associated with a multiphase electric motor.

FIG. 4 is a block diagram that illustrates how multiple current sensors 11 can be used to measure various electrical currents associated with a multiphase electric motor 14. As illustrated, the electric motor 114 comprises a three-phase electric motor 14 that has three input phases. For example, each phase may have an alternating current input signal that is out of phase with the other input phases by a fixed amount (e.g., approximately 120 degrees of phase shift). A different current sensor 11 is associated with each of the phase inputs. Each of the phase inputs is associated with a corresponding conductor (16, 116, 216). FIG. 4 shows three conductors (16, 116, 216) between output terminals of the inverter 110 and input terminals of the electric motor 114. Each current sensor 11 may detect a different observed aggregate current and a change in current for each of the phases.

Figure 5:
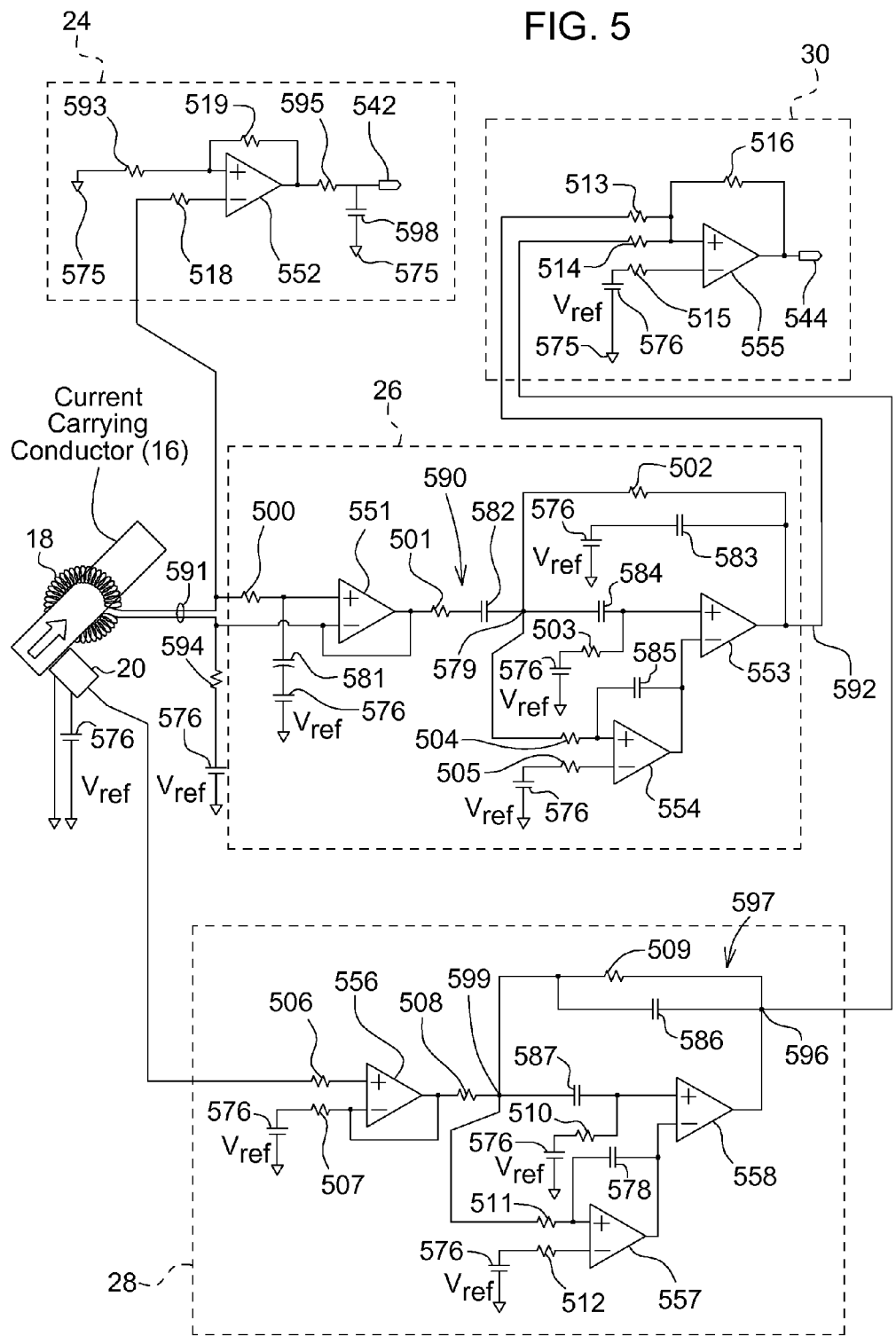
FIG. 5 shows illustrative circuits in greater detail consistent with the block diagram of FIG. 1.

FIG. 5 shows illustrative circuits in greater detail consistent with the block diagram of FIG. 1. Like reference numbers in FIG. 1, FIG. 2 and FIG. 5 indicate like elements.

A first filtering circuit 26 has a high-pass filter response. In one embodiment, the high-pass filter response is supported by the series combination 590 of a resistor 501 and a capacitor 582, where the capacitor 582 blocks or attenuates a direct current signal. The first filtering circuit 26 is coupled to the inductor 18 to receive an alternating current signal (e.g., first alternating current signal) at an input terminal 591 of the first filtering circuit 26 and to provide a filtered alternating current signal component (e.g., first alternating signal component) at an output terminal 592 of the first filtering circuit 26. The first filtering circuit 26 comprises a first amplifier 551, a second amplifier 554, and a third amplifier 553, and associated resistors and capacitors.

In one embodiment, the first amplifier 551 forms a unity gain follower circuit in which the unity gain follower buffers the alternating current signal from the inductor 18. Because the output of the first amplifier 551 is fed to the input (e.g., negative input terminal) of the first amplifier 551, the input voltage equals the output voltage for the first amplifier 551. One input terminal (e.g., positive input terminal) of the first amplifier 551 is connected to resistor 500 and capacitor 581. The capacitor 581 is fed by a positive terminal of reference voltage source 576. The negative input terminal of the first amplifier 551 is coupled to a positive terminal of reference voltage source 576 via resistor 594. In turn, the negative terminal of the reference voltage source 576 is connected to ground or common 575. The input terminals (e.g., two input terminals) of the first amplifier 551 are coupled to the terminals or taps of the inductor 18, where the positive input terminal of first amplifier 551 is coupled to the inductor 18 via series resistor 500.

The series combination 590 of resistor 501 and capacitor 582 are connected to the output of the amplifier 551 to support a high-pass filter response by attenuating or blocking a direct current signal from reaching other amplifiers (553, 554) within the first filtering circuit 26 at intermediate node 579.

The second amplifier 554 forms part of an integrating circuit that integrates or averages a value of an alternating current input signal at intermediate node 579. The capacitor 585 is selected based on the frequency of the alternating current input signal. One input terminal (e.g., positive input terminal) of the second amplifier 554 is connected to a resistor 504, whereas the other input terminal (e.g., negative input terminal) of the second amplifier 554 is connected to resistor 505 that is fed by a reference voltage source 576.

At one input terminal (e.g., positive input terminal), the third amplifier 553 receives an input signal via one or more of the following network elements to provide a high pass frequency response: (1) the series tuned circuit 590, (2) capacitor 582, or (3) capacitor 584. For example, the third amplifier 553 may amplify the signal in a pass-band frequency range that is proportional to a ratio of the resistance of resistor 502 to that of resistor 501. The input terminal (e.g., positive input terminal) of the amplifier 553 is connected to series combination of resistor 503 and voltage reference source 576. Similarly, an output terminal of the third amplifier 553 is connected to a series combination of capacitor 583 and a voltage reference source 576.

In one configuration, the third amplifier 553 can functions as a comparator that compares the inputs from the first amplifier 551 and the second amplifier 554 and generates or outputs a filtered first signal to indicate when the first input at intermediate node 579 differs from the second input (e.g. at the negative input terminal of amplifier 553).

A second filtering circuit 28 has a low-pass filter response. The second filtering circuit 28 coupled to the magnetic field sensor 20 to provide: (1) a filtered direct current signal component, (2) a lower frequency alternating signal component (e.g., second alternating signal component), or both. The second filtering circuit 28 comprises a first amplifier 556, a second amplifier 557, and a third amplifier 558, and associated resistors and capacitors. In one embodiment, the first amplifier 556 forms a unity gain follower circuit in which the unity gain follower buffers the signal from the magnetic field sensor 20. Because the output of the first amplifier 556 is fed back to the input (e.g., negative input) of the first amplifier 556, the input voltage equals the output voltage for the first amplifier 556. One input (e.g., positive input) of the first amplifier 556 is connected to resistor 506, whereas the other input (e.g., negative input) of the first amplifier 556 is connected to the series combination of resistor 507 and voltage reference source 576.

The second amplifier 557 forms part of an integrating circuit that integrates or averages a value of an alternating current input signal at central node 599. The capacitor 578 is selected based on the frequency of the alternating current input signal at node 599 or of the low frequency alternating signal component from the magnetic field sensor 20.

The third amplifier 558 works in conjunction with the feedback from the parallel tuned circuit 597 to provide a low pass response. As illustrated the parallel tuned circuit 597 is in the feedback path between the input (e.g., positive input terminal) and output terminal 596 of the third amplifier 558. The tuned circuit 597, alone or in combination with the third amplifier 558, can pass direct current signals, lower alternating current frequencies, or both to the output terminal 596 of the second filtering circuit 28 and the input of the sensor fusion circuit 30. For example, the third amplifier 558 may amplify the signal in a pass-band frequency range that is proportional to a ratio of resistor 509 to the resistor 508, near the central node 599. In one embodiment, the low-pass filter response is provided by a tuned circuit 597 formed of a parallel combination of capacitor 586 and resistor 509.

One input terminal (e.g., positive input terminal) of the third amplifier 558 is connected to a capacitor 587 and a series combination of resistor 510 and voltage reference source 576. The other input terminal (e.g., negative input terminal) of the third amplifier 558 is fed by the output of the second amplifier 557.

In one configuration, the third amplifier 558 can function as a comparator that compares the inputs from the first amplifier 556 and the second amplifier 557 and generates or outputs a filtered first signal to indicate when the first input differs from the second input.

In one embodiment, a sensor fusion circuit 30 determines an aggregate sensed current based on: (1) the filtered alternating current signal component and the filtered direct current signal component, or (2) the first filtered signal component and the second filtered signal component, where the first filtered signal component comprises a first filtered alternating current signal component and where the second filtered signal component comprises a direct current signal component and lower frequency alternating current signal component that is lower in frequency that the first filtered alternating current signal component. The aggregate sensed current refers to the combined current that includes contributions of the direct current signal components and alternating signal components. The sensor fusion circuit 30 comprises an operational amplifier 555 in a summing amplifier arrangement in which the inputs at a first resistor 513 and second resistor 514 are summed to produce an output voltage that is proportional to the sum of the input voltages at one input terminal (e.g., positive input terminal) of the amplifier 555. A reference voltage source 576 is applied to the other input terminal (e.g., negative input) of the operational amplifier 555 via a resistor 515, where a change in the reference voltage (e.g., variable reference voltage) can be used to scale or adjust the output of the sensed current. The sensor fusion output terminal 544 provides a current indicator of aggregate current flowing within the conductor 16, for example.

The current change sensor 24 comprises an amplifier 552 with a first input terminal (e.g., negative input terminal) coupled to inductor 18 via resistor 518 and a second input terminal (e.g., positive input terminal) coupled to ground (or a reference voltage source) via resistor 593. The feedback resistor 519 is connected between the input terminal (e.g., positive input terminal) and output terminal of the amplifier 552. The current change sensor output terminal 542 provides a current indicator of the change versus time of current flowing in the conductor 16. In one embodiment, an output resistor 595 is connected in series between the output of terminal of the amplifier 552 and the current change sensor output terminal 542, where a capacitor 598 is connected between the current change sensor output terminal 542 and ground 575.

Figure 6:
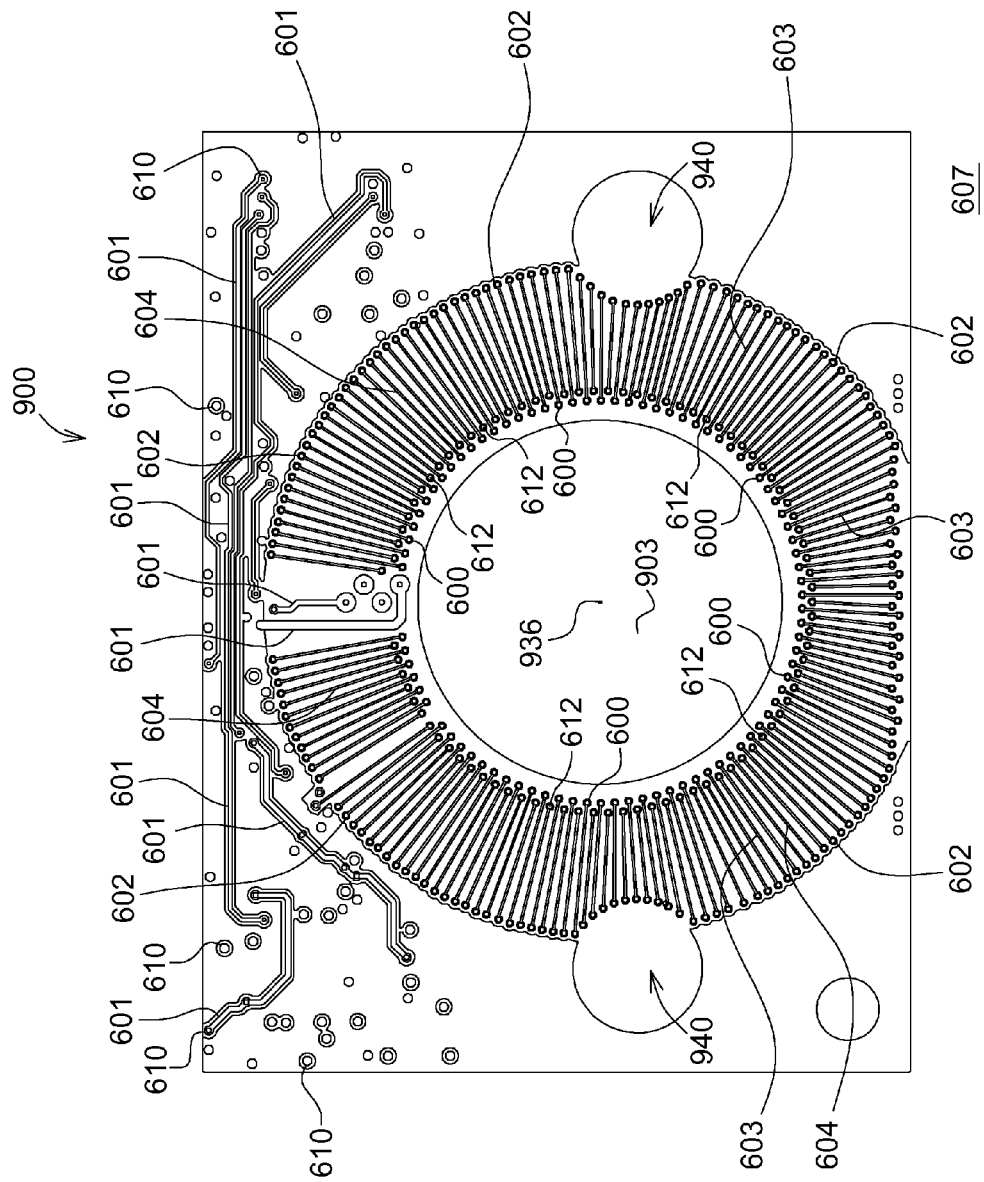
FIG. 6 shows a plan view of first layer of conductive traces, associated with an inductor, with an outer layer of a multi-layered substrate removed to better show the first layer, where the first layer is associated with a first internal layer of the substrate.

FIG. 6 shows a plan view of first layer of first conductive traces (603, 604), associated with an inductor 18, with an outer layer of a multi-layered substrate 900 removed to better show the first layer 607, where the first layer is associated with a first internal layer 607 of the multi-layered substrate 900 (e.g., multi-layered circuit board).

In one embodiment, the first layer of first conductive traces (603, 604) comprises buried conductive traces. The first conductive traces (603, 604) are generally linear segments that are radially extending with respect to a central axis 936. As illustrated, a set or some first conductive traces (e.g., 604) are longer than other first conductive traces (e.g., 603) of the first layer. However, the first conductive traces (603, 604) may be of the same length in alternate embodiments.

Each first conductive trace (603, 604) may terminate in an electrical and mechanical connection to an inner buried via (600, 612), or an outer buried via 602 to facilitate the formation of inductor with another layer (e.g., besides layer 607) of the multilayered substrate 900.

Although first the conductive traces (603, 604) occupy a generally annular area on the substrate or circuit board, the first conductive traces (603, 604) may deviate from a completely annular area with one or more notches 940, for example. The central axis 936 and a region inward from the generally annular area is associated with an opening 903 for inserting or positioning the conductor 16 to be observed or measured, with respect to its electrical current.

Besides the first conductive traces (603, 604), the first layer may comprise first supplemental conductive traces 601 and supplemental conductive vias 610 for interconnecting one or more components on the substrate. In one configuration, the first supplemental first traces 601 and the supplemental conductive vias are buried in the multi-layered substrate 900.

Figure 7:
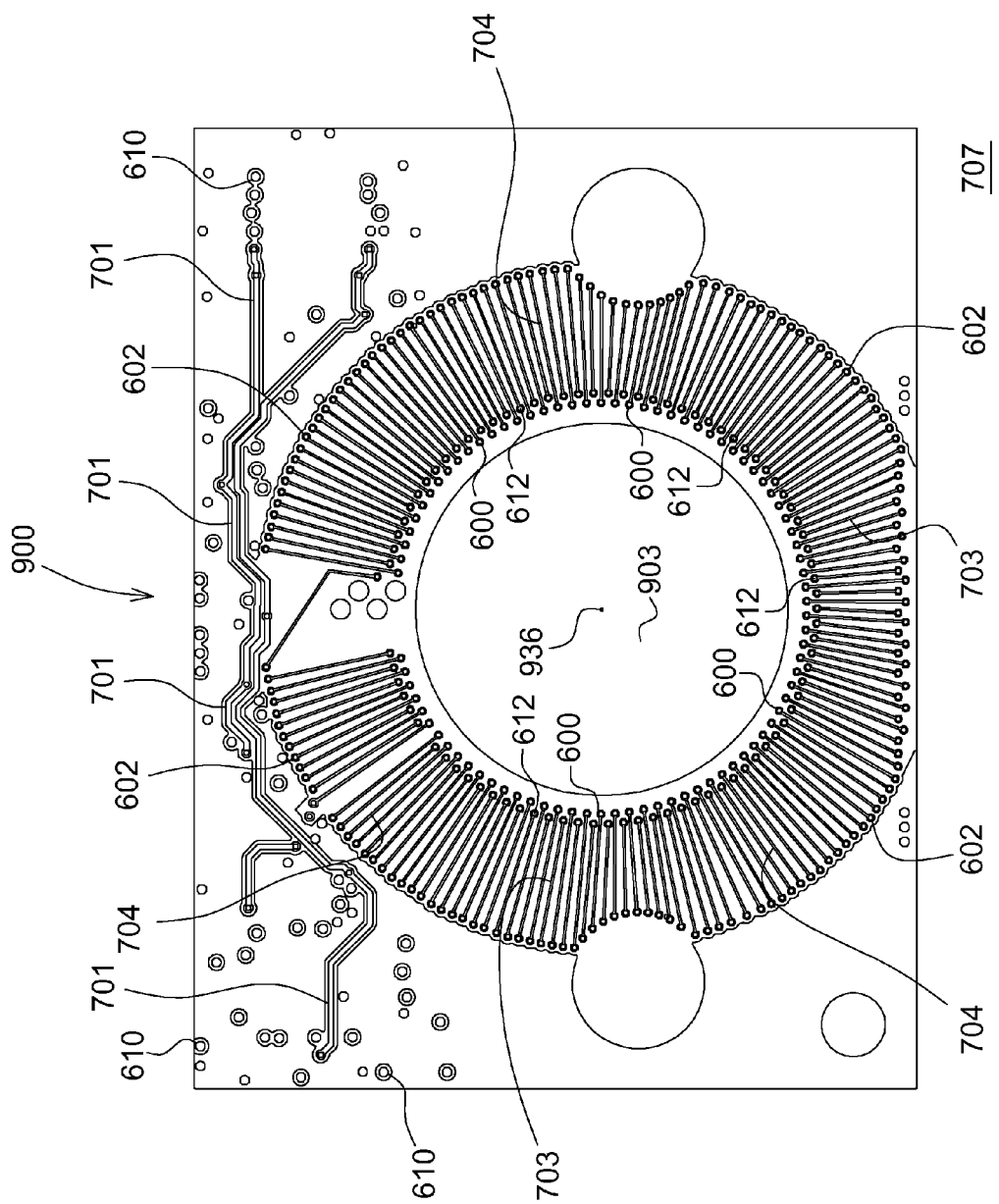
FIG. 7 shows a plan view of a second layer of conductive traces, associated with the inductor, with an outer layer of the substrate removed to better show the second layer, where the second layer is associated with a second internal layer and is on internal opposite side of the substrate from the first layer.

FIG. 7 shows a plan view of a second layer of second conductive traces (703, 704), associated with the inductor 18, with an outer layer of the substrate removed to better show the second layer, where the second layer is associated with a second internal layer (707) and is on internal opposite side of the substrate from the first internal layer 607 of the multi-layered substrate 900 (e.g., multi-layered circuit board).

In one embodiment, the first layer of second conductive traces (703, 704) comprises buried conductive traces. The second conductive traces (703, 704) are generally linear segments that are radially extending with respect to a central axis 936. As illustrated, a set or some second conductive traces (e.g., 704) are longer than other second conductive traces (e.g., 704) of the first layer. However, the second conductive traces (703, 704) may be of the same length in alternate embodiments.

Each second conductive trace (703, 704) may terminate in an electrical and mechanical connection to an inner buried via (600, 612), or an outer buried via 602 to facilitate the formation of inductor with another internal layer (e.g., internal layer 607 of FIG. 6) of the multilayered substrate 900.

Although the second conductive traces (703, 704) occupy a generally annular area on the substrate or circuit board, the second conductive traces (703, 704) may deviate from a completely annular area with one or more notches 940, for example. The central axis 936 and a region inward from the generally annular area is associated with an opening 903 for inserting or positioning the conductor 16 to be observed or measured, with respect to its electrical current.

Besides the second conductive traces (703, 704), the first layer may comprise second supplemental conductive traces 701 and supplemental conductive vias 610 for interconnecting one or more components on the substrate. In one configuration, the second supplemental conductive traces 701 and the supplemental conductive vias 610 are buried in the multi-layered substrate 900.

In one embodiment, the first conductive traces (603, 604) of FIG. 6 and second conductive traces (703, 704) of FIG. 7 are arranged in a series of layers that are spaced apart from each other by intervening dielectric portions of a substrate 900. The conductive traces (e.g., first and second conductive traces 603, 604, 703, 704) and conductive vias (600, 602, 612) (e.g., buried vias) form an inductor 18 with at least two taps or terminals, where the conductive traces of each layer of the layers are confined to a generally annular region on the substrate 900.

Figure 8:
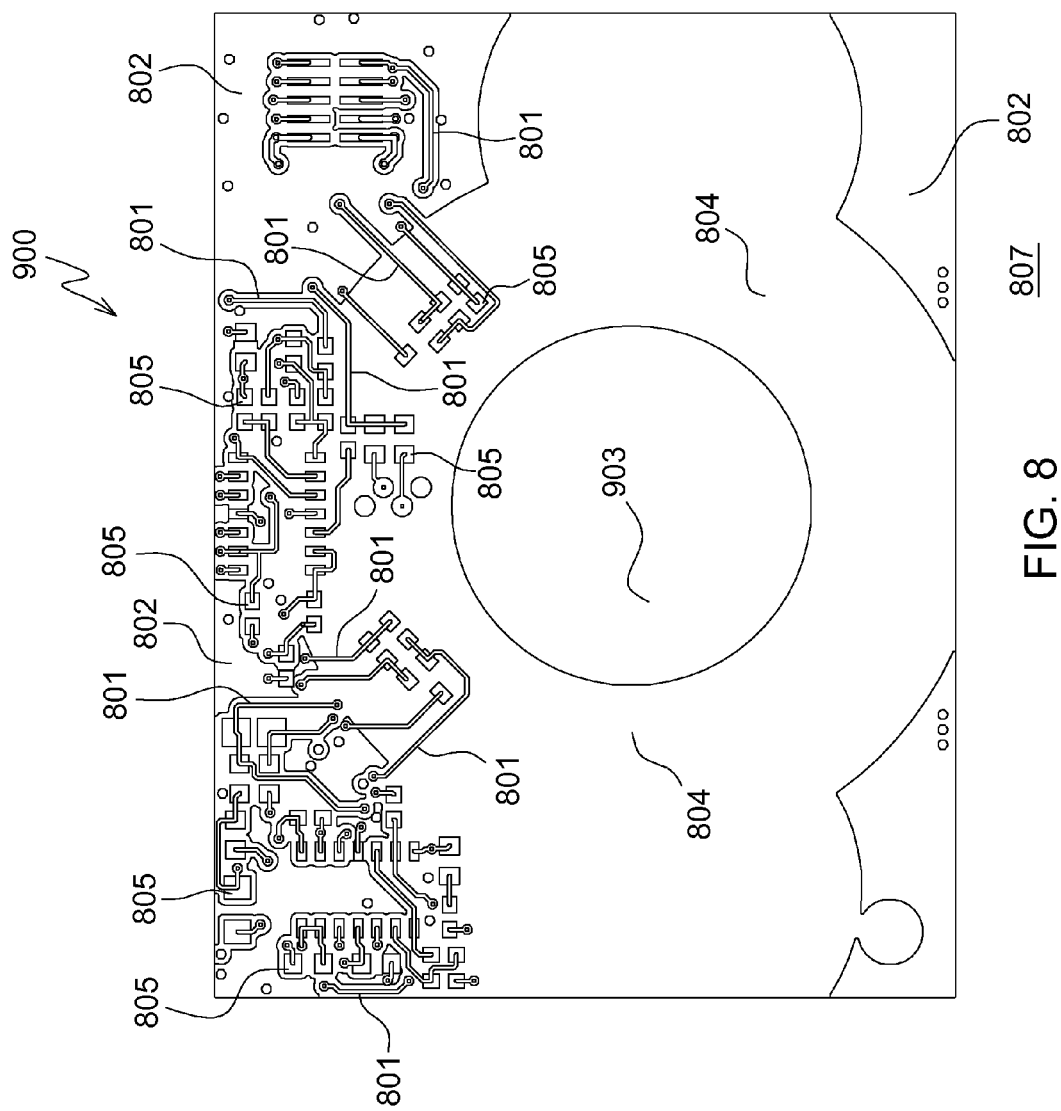
FIG. 8 shows a plan view of a first outer layer of the substrate.
Figure 9:
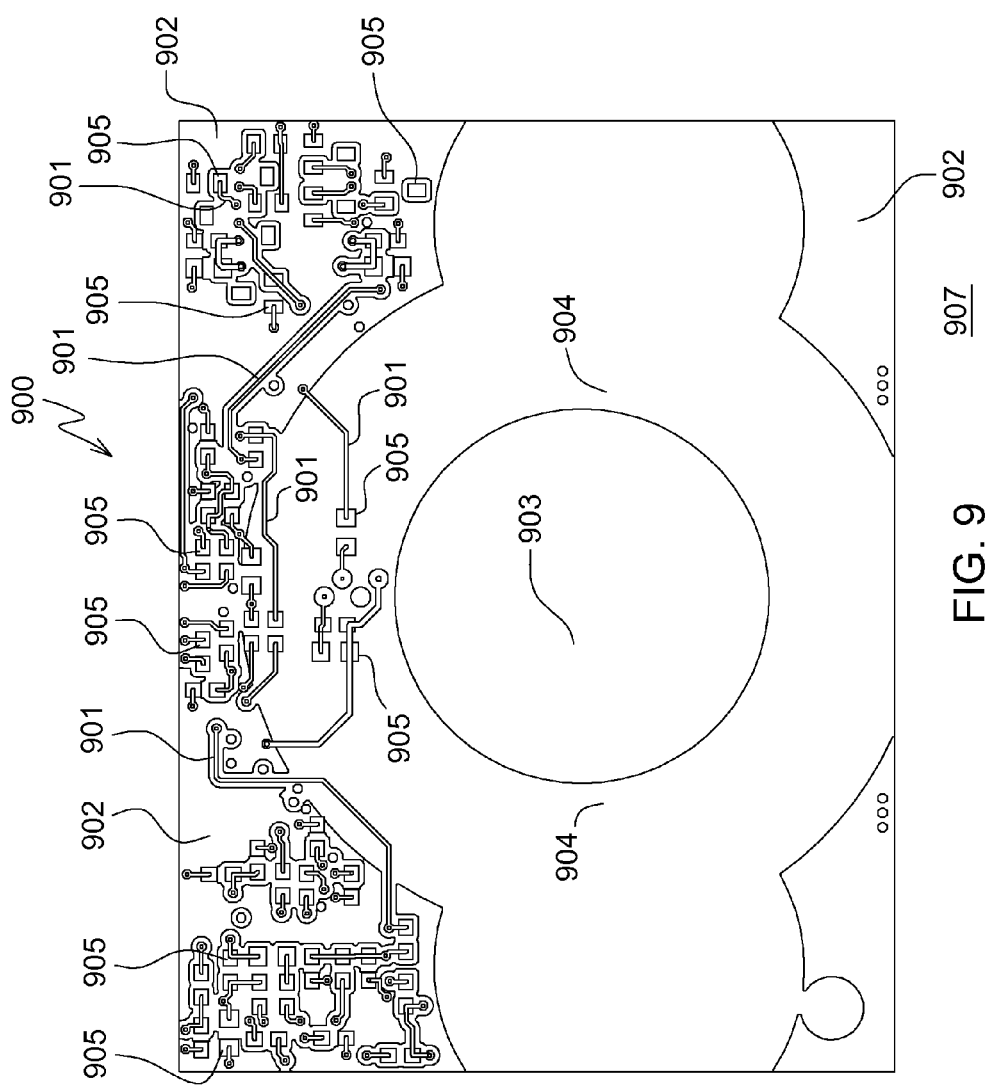
FIG. 9 shows a plan view a second outer layer of the substrate on an external opposite side of the substrate from the first outer layer.

FIG. 8 shows a plan view of a first outer layer 807 of the substrate 900. FIG. 9 shows a plan view a second outer layer 907 of the substrate on an external opposite side of the substrate 900 from the first outer layer 807. Like reference numbers in FIG. 6 through FIG. 9, inclusive, indicate like elements.

The first filtering circuit 26, the second filtering circuit 28 and the sensor fusion circuit 30 are formed by mounting electronic components on one or more sides of the substrate 900 or multi-layered circuit board in a region outward from an annular region 804 or annular volume of the inductor 18. For example, the first filtering circuit 26, the second filtering circuit 28 and the sensor fusion circuit 30 may be mounted on the first outer layer 807 of the substrate 900, the second outer layer 907 of the substrate 900, or both. The first filtering circuit 26, the second filtering circuit 28 and the sensor fusion circuit 30 each comprise one or more operational amplifiers, capacitors, resistors, or any other components 805 (e.g., electrical, semiconductor, or electronic components) that are interconnected via secondary circuit traces 801 on the substrate. The first outer layer 807 may have a conductive ground plane 802. The resistors and capacitors may be used in conjunction with the operational amplifiers to form active filters with desired frequency responses, for example.

FIG. 9 shows a plan view of a second outer layer 907 of the substrate 900. FIG. 9 shows a plan view a second outer layer 907 of the substrate on an external opposite side of the substrate 900 from the first outer layer 807. Like reference numbers in FIG. 6 through FIG. 9, inclusive, indicate like elements.

The first filtering circuit 26, the second filtering circuit 28 and the sensor fusion circuit 30 are formed by mounting electronic components on one or more sides of the substrate 900 or multi-layered circuit board in a region outward from an annular region 904 or annular volume of the inductor 18. For example, the first filtering circuit 26, the second filtering circuit 28 and the sensor fusion circuit 30 may be mounted on the first outer layer 807 of the substrate 900, the second outer layer 907 of the substrate 900, or both. The first filtering circuit 26, the second filtering circuit 28 and the sensor fusion circuit 30 each comprise one or more operational amplifiers, capacitors, resistors, or any other components 905 (e.g., electrical, semiconductor, or electronic components) that are interconnected via secondary circuit traces 901 on the substrate. The second outer layer 907 may have a conductive ground plane 902. The resistors and capacitors may be used in conjunction with the operational amplifiers to form active filters with desired frequency responses, for example.

Figure 10:
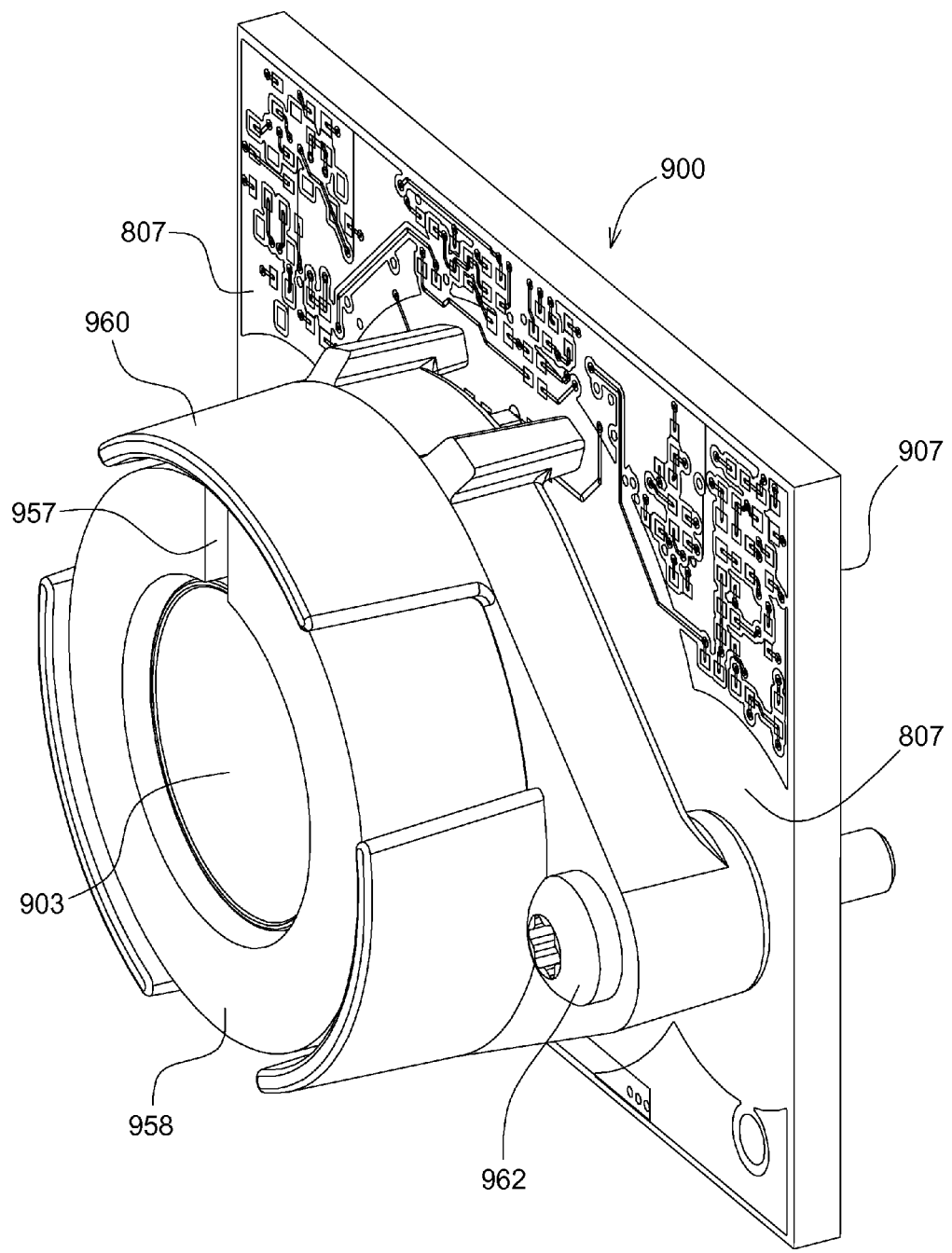
FIG. 10 shows a ferrite structure (e.g., toroidal core) for mounting around the conductor.

FIG. 10 shows a ferrite structure 958 (e.g., toroidal core) for mounting around the conductor 16 (e.g., 16) in which the current is to be measured. Like reference numbers in FIG. 6 through FIG. 10 indicate like elements.

The ferrite structure 958 is secured or held to the first outer layer 807 of the substrate 900 by a retainer 960 or core holder. In one embodiment, the retainer 960 has an annular recess for receipt of the ferrite structure 958 or toroidal ferrite core. The retainer 960 may be fastened to the substrate 900 via one or more fasteners 962.

The current sensor (e.g., 11 or 111) of FIG. 6 through FIG. 10, inclusive, comprises an inductor 18 formed of conductive traces (603, 604, 703, 704) and conductive vias (600, 602, 612) of a substrate 900 (e.g., multi-layered printed circuit board). For example, the inductor 18 may comprise a Time Varying Flux Sensor (TVFS) coil pattern using buried vias and traces in a multi-layered printed circuit board (PCB). Buried vias (600, 602, 612) and buried traces (603, 604, 703, 704) allow the inductor 18 to encircle and stay in close vicinity or proximity of current carrying conductor 16 (high voltage circuit) without compromising reinforced (double) insulation between high voltage and low voltage electronics. In practice, the current sensor 11 or 111 and its inductor 18 operate a lower voltage level, whereas the current carrying conductor 16 operates a higher voltage level than the lower voltage level.

Because the inductor 18 measures only time-varying current or flux such as an alternating current (AC) signal, for direct current measurement a magnetic field sensor 20 (e.g., a programmable Hall sensor) is used. To raise the sensitivity of the magnetic field sensor 20 (e.g., Hall sensor), the ferrite structure 958 or low-loss, gapped toroidal ferrite core is deployed sufficiently spaced apart from the inductor 18 TVFS coil. The gap 957 in the ferrite structure is a slot or break in the general annular shape or toroidal shape of the ferrite structure 958. The ferrite structure 958 offers desired performance under extreme operating conditions exhibited by high frequency (e.g., greater than approximately 500 Hz) fundamental alternating current (AC) current of high magnitude (e.g., greater than approximately 500 Amps, root mean squared (rms)). In one embodiment, the magnetic field sensor 20 is positioned in air gap 957 made in the ferrite structure 958.

A second filtering circuit 28 processes signal sensed by the magnetic field sensor 20 (e.g., Hall sensor or Hall probe). The sensor fusion circuit 30 combines signals from inductor 18 and magnetic field sensor 20 after the signals are processed by the first filtering circuit 26 and the second filtering circuit 28, respectively. The sensor fusion circuit 30 offers desired frequency response over a target frequency range (e.g., from direct current (DC) to high frequency (e.g., approximately 1000 Hz or greater) fundamental alternating current (AC) without any loss of gain and occurrence of phase shift between input and output signals.

The current sensor (11 or 111) comprises low voltage electronics mounted on a substrate 900 (e.g., circuit board). The low voltage electronics comprise one or more of the following circuits: (a) a first filtering circuit 26 (e.g., high pass filter), (b) a second filtering circuit 28 (e.g., low pass filter), (c) a sensor fusion circuit 30 (e.g., combiner), (d) current change detector 24, and (e) a temperature sensor 52. In one embodiment, the temperature sensor 52 is mounted very close to (e.g., few millimeter) high current connection made between inverter power modules (e.g., that use insulated gate bipolar transistors (IGBT's), metal oxide semiconductor field effect transistors (MOSFET's), or other power semiconductors) and an external load (e.g., an electric motor 14) coupled to the inverter 10.

The inductor 18 on the substrate allows enough remaining space for low voltage electronics (e.g., circuits 26, 28, 30, 24, and 52) to be packaged on outer layers (807, 907) of multi-layered substrate 900 to result in a smaller or compact footprint for current sensor (11 or 111). Further, there is sufficient mounting space on the substrate 900 to include a built-in temperature sensor 52 and a current change detector 24.

Figure 11:
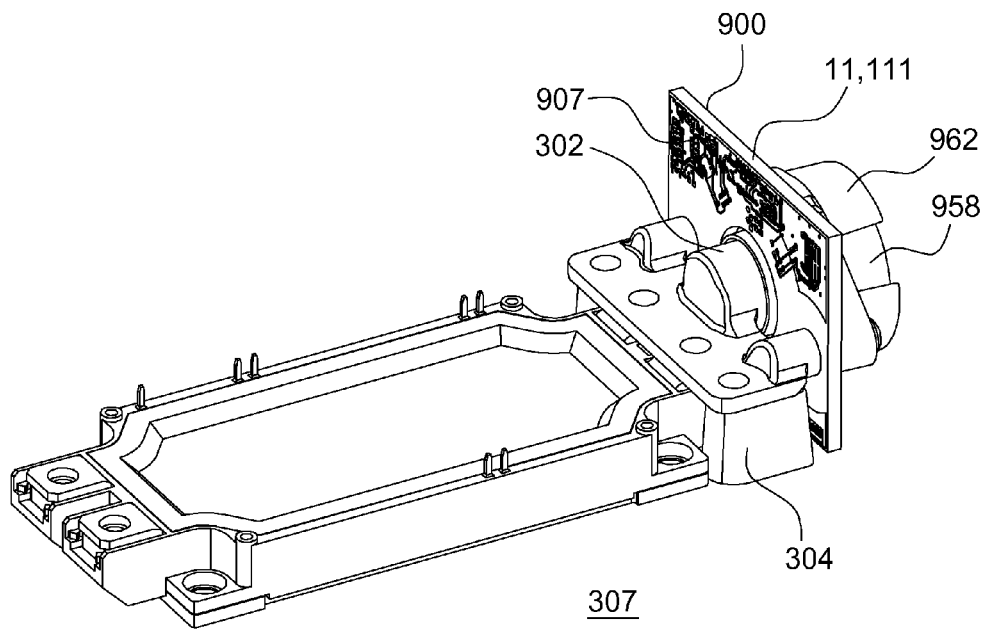

FIG. 11 shows the substrate 900 of the current sensor 11 or 111 mounted on an electronic assembly 307, such as an inverter 10 or a controller. Like reference numbers in FIG. 1 through FIG. 12, inclusive, indicate like elements.

Figure 12:
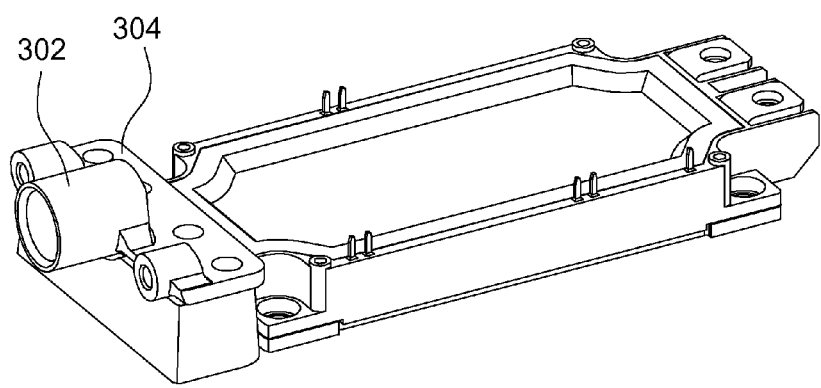

In FIG. 11 and FIG. 12, the current sensor (e.g., 11 or 111) or its associated electromechanical assembly has a high power connector 302 or socket for receiving the conductor 16. In FIG. 11, the substrate 900 of the current sensor (11 or 111) is connected to or supported by the housing 304, whereas in FIG. 12, the substrate 900 is omitted to better illustrate the connector 302. The connector 302 may comprise a generally cylindrical socket, for example. In one embodiment, the housing 304 supports the substrate 900 in a generally perpendicular plane with respect to an axis of any conductor (16) that is inserted into or connected to the connector 302, although other mounting configurations of the substrate 900 can fall within the scope of appended claims.

In FIG. 13, illustrates the assembly 307 of FIG. 11 from a different perspective than FIG. 11. Further, FIG. 13 shows a perspective semi-exploded view of the assembly 307 where a mating portion 309 (e.g., plug) of the conductor 16 is shown as removed from the opening 903 in the ferrite structure 958 and the associated substrate 900. Like reference numbers in FIG. 1 through FIG. 13, inclusive, indicate like elements.

FIG. 14 is similar to FIG. 13, except the ferrite structure 950 is replaced with dual ferrite structure 1958 and the mating portion 309 engages the connector 302. Like references in FIG. 1 through FIG. 14, inclusive, indicate like elements. In FIG. 14, the mating portion 309 or plug of the conductor 16 is positioned in the connector 302. The conductor 16 mates with the high current connector socket of the current sensor (11 or 111). The dual ferrite structure 1958 comprises two ferrite members 315, where on is positioned on each side of the magnetic field sensor 20 (e.g., Hall Effect sensor). As shown, each one, of the two ferrite members 315 in FIG. 14, is generally rectangular or polyhedral, although other shapes of ferrite members may be used and fall within the scope of certain claims appended hereto. The magnetic field sensor 20 or its inductive probe may be bounded by a ferrite member 315 on one or more sides, along a common axis 314. The surface-mounted, dual ferrite structure 1958 works as a magnetic flux concentrator to direct magnetic flux to the magnetic field sensor 20 (e.g., Hall Effect sensor). The dual ferrite structure 1958 and arrangement of FIG. 14 can achieve similar performance as a gapped torodial ferrite core. Further, the dual ferrite structure 1958 eliminates the need of a retainer 960 (FIG. 10) or core holder.

In one configuration, the dual ferrite structure 1958 comprises a magnetic flux concentrator on either the first outer layer 807 or second outer layer 809 of substrate 900. The configuration of FIG. 14 uses the free volume or headroom over the power semiconductor of the inverter to make the current sensor (11 or 111) or its assembly as compact as possible. In some embodiments, only a few millimeters of clearance are needed from the closest surface of the power semiconductor package (e.g., IGBT) to inverter wall or inverter housing.

The current sensor (e.g., 11 or 11) is capable of having a compact footprint that is smaller than many commercially available current sensors. The current sensor is well-suited to outperform certain commercially available current sensing schemes over a wide frequency (e.g., 0 Hz to 1000 Hz and beyond), an expansive current range (e.g., 0 A to approximately 500 Amps root mean squared (rms)), and a great temperature range (e.g., approximately −40 degrees Celsius to approximately 125 degrees Celsius).

The current rating and operating range of frequency (e.g., approximately 0 Hz to 1000 Hz (approximately) and beyond) is easily scalable, particularly with scheme shown in FIG. 14. For example, the magnetic field sensor 20 (e.g., Hall Effect sensor) may feature programmable sensitivity (e.g., measured in milliVolt (mV)/Gauss). The inductor 18 (e.g., substrate-based inductor design) may encircle, partially surround, or entirely surround the conductor 16, typically without requiring any change in a diameter or size of the opening 903 in the substrate 900 for supporting the inductor 18. In one configuration, the diameter of socket 302 and plug 309 can be adapted for current rating beyond 500 Amps root mean squared (rms). The configurations in this disclosure are well-suited for supporting a wide operating range of output frequencies of the inverter and extensive range of measured currents flowing through the conductor 16. This current sensor (11 or 111) does not require any potting material such as resin, silicone, polymer, or polymeric matrix; therefore, it suited for ambient storage or operation in temperature of approximately −55 degrees Celsius and below.

In one embodiment, the high current connector sensor (11 or 111) exhibits built-in thermal management when connector 302 or socket is placed and bolted down to power module terminals because heat loss at the connector 302 is thermally conducted to the housing 304 or its heat sink associated with the inverter (10). The high current connector 302 or socket makes connection to using a mating portion 309, such as a high current pin inserted into socket. For low resistance (e.g., less than 50 micro ohms or lower) connection, connector 302 or socket could deploy multi-lams to make tight contact with the mating portion 309 or pin while allowing a prodigious number of paths for current that flows between the connector 302 and the mating portion 309. The mating portion 309 or pin is depicted in FIG. 13 and FIG. 14; non-mating end of the mating portion 309 or pin is crimped with conductor 16, such as a high current cable to feeds power to load that could be away from inverter 10. As illustrated in certain figures, such as FIG. 14, the connector plug 309 and socket 302 form the portion of the conductor 16 where proposed current sensing scheme resides in inverter 10 assembly.

Various alternative embodiments or variations of the above embodiments may fall within the scope of the appended claims. In one example, the ferrite structure 958 or toroidal core for use with magnetic field sensor 20 (e.g., Hall element) as flux concentrator can be deleted for increased sensitivity and noise immunity for stray magnetic field. The deleted toroidal core is replaced by metal shield 378*ing* to shield against magnetic or electromagnetic fields. For example, the metal shield 378*ing* may comprise a metal screen or one or more metal walls for mounting around a periphery of the magnetic field sensor 20 on the substrate to project perpendicularly from an outer surface of the substrate.

In an alternate embodiment, windings of the inductor 18 could be wound partially or entirely on a gapped toroidal core, rather than being formed of the conductive traces and buried vias of the substrate. However, winding the inductor 18 on the toroidal core could increase cost of the assembly and raises the possibility of safety issues associated with insulation between high voltage electronics and low voltage electronics.

In another alternate embodiment, the filtering circuits could be replaced with digital or advanced filtering techniques, where the filtering circuits are housed in field programmable gate array (e.g., FPGA), digital signal processor (e.g., DSP) or a microprocessor. This will increase dependency of firmware needed to implement currents sensing scheme.

Figure 15:
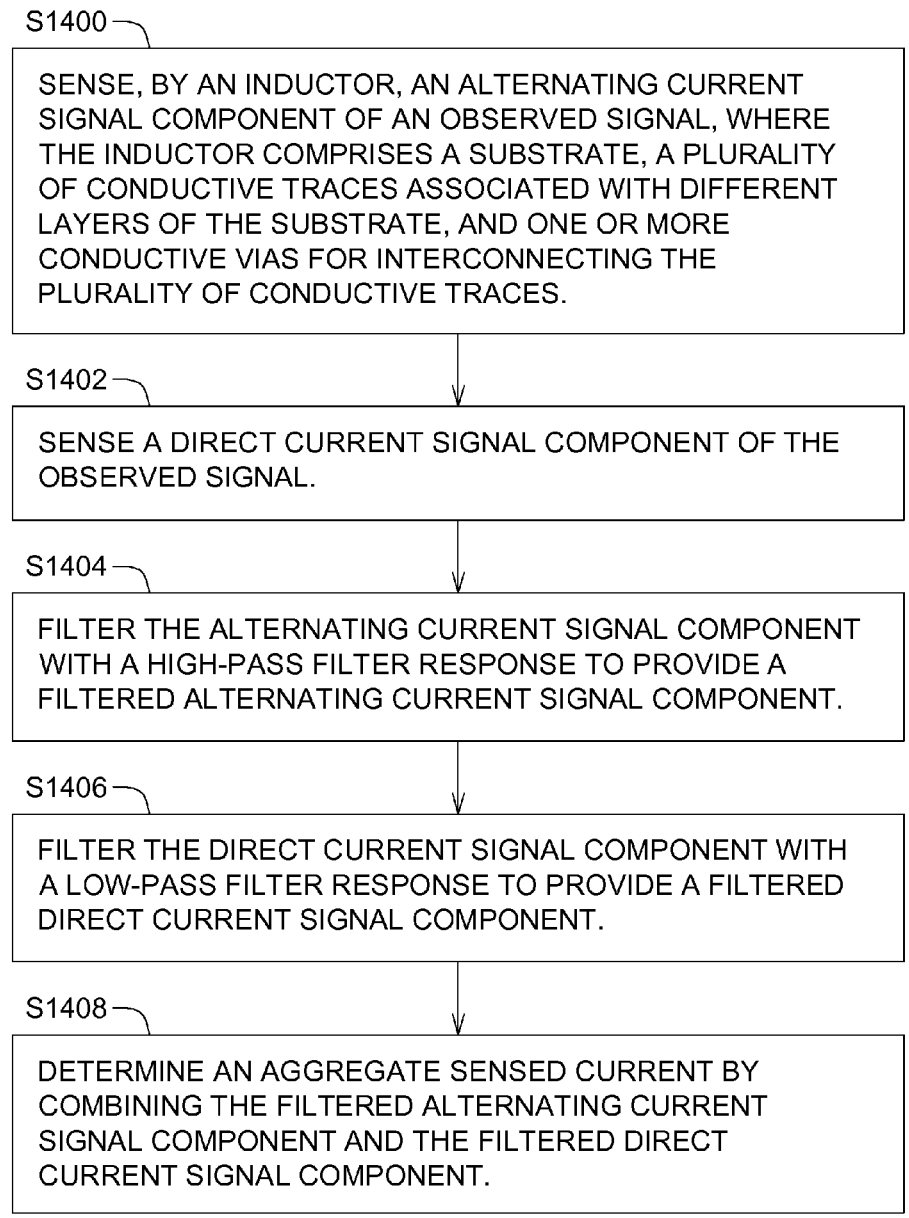
FIG. 15 is flow chart of one example of a method for sensing current in a conductor.

FIG. 15 illustrates a flow chart for one embodiment of a method for sensing current. The method of FIG. 15 begins in step S1400.

In step S1400, an inductor 18 senses an alternating current signal component of an observed signal. Step S1400 may be carried out in accordance with various techniques, which may be applied alternately or cumulatively.

Under a first technique, the inductor 18 comprises a substrate, a plurality of conductive traces (e.g., buried conductive traces) associated with different layers of the substrate, and one or more conductive vias (e.g., buried vias) for interconnecting the plurality of conductive traces.

Under a second technique, the inductor 18 is arranged, oriented or positioned to be proximate or near a conductor that connects an inverter output of an inverter to an electric motor. For example, the conductor may intercept an opening 903 in the substrate 900 or a central region or volume of the inductor 18.

Under a third technique, the inductor 18 is formed by arranging the conductive traces in the different layers that are spaced apart from each other by intervening dielectric portions of a substrate wherein the conductive traces are radially extending with respect to a central axis and are limited to occupy a generally annular area or volume of the substrate.

In step S1402, a magnetic field sensor 20 senses a direct current signal component of the observed signal. In one configuration, the magnetic field sensor (e.g., Hall Effect sensor), or its probe, is arranged, oriented or positioned to be proximate or near a conductor that connects an inverter output of an inverter to an electric motor.

In step S1404, a first filtering circuit 26 filters the alternating current signal component with a high-pass filter response to provide a filtered alternating current signal component. In one configuration, the first filtering circuit 26 is assembled or made by mounting electronic components on one or more sides of the substrate in a region outward from an annular region or annular volume of the inductor to form at least one of a first filtering circuit, a second filtering circuit and a sensor fusion circuit on the substrate.

In step S1406, a second filtering circuit 28 filters the direct current signal component with a low pass filter response to provide a filtered direct current signal component. In one configuration, the second filtering circuit 28 is assembled or made by mounting electronic components on one or more sides of the substrate in a region outward from an annular region or annular volume of the inductor to form at least one of a first filtering circuit, a second filtering circuit and a sensor fusion circuit on the substrate.

In step S1408, a sensor fusion circuit 30 determines an aggregate sensed current by combining the filtered alternating current signal component and the filtered direct current signal component. For example, the sensor fusion circuit 30 scales a first gain of the filtered alternating signal component and a second gain of the filtered direct current signal component to obtain a conversion factor between actual current of the observed signal flowing through the conductor and the aggregate sensed current. In one configuration, the sensor fusion circuit 30 is assembled or made by mounting electronic components on one or more sides of the substrate in a region outward from an annular region or annular volume of the inductor to form at least one of a first filtering circuit, a second filtering circuit and a sensor fusion circuit on the substrate.

Figure 16:
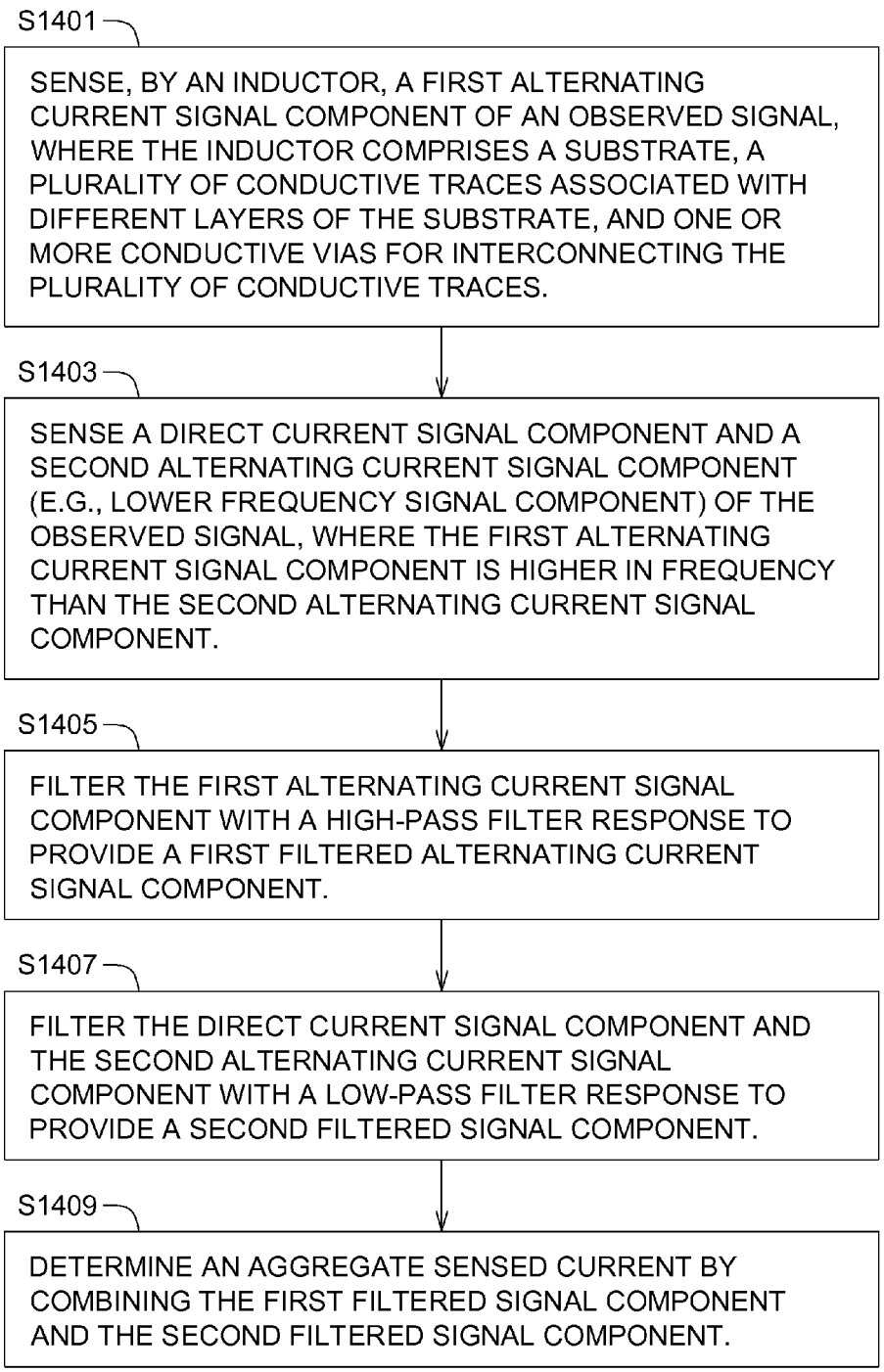
FIG. 16 is flow chart of another example of a method for sensing current in a conductor.

FIG. 16 illustrates a flow chart for one embodiment of a method for sensing current. The method of FIG. 16 begins in step S1401.

In step S1401, an inductor 18 senses a first alternating current signal component of an observed signal. In one embodiment, the inductor 18 comprises a substrate, a plurality of conductive traces associated with different layers of the substrate, and one or more conductive vias for interconnecting the plurality of conductive traces.

In step S1403, a magnetic field sensor 20 senses a direct current signal component and a second alternating signal component (e.g., a lower frequency signal component) of the observed signal, where the first alternating signal component is higher in frequency than the second alternating signal component.

In step S1405, a first filtering circuit 26 filters the first alternating current signal component with a high-pass filter response to provide a first filtered signal component.

In step S1407, a second filtering circuit 28 filters the direct current signal component and the second alternating current signal component with a low pass filter response to provide a second filtered signal component.

In step S1409, a sensor fusion circuit 30 determines an aggregate sensed current by combining the first filtered signal component and the second filtered signal component.

In alternate embodiments of the above methods, additional steps may be added to the method of FIG. 15 or FIG. 16, such as determining a change in current versus time for the alternating signal component or estimating a temperature of a conductor for carrying the observed signal.

Figure 17:
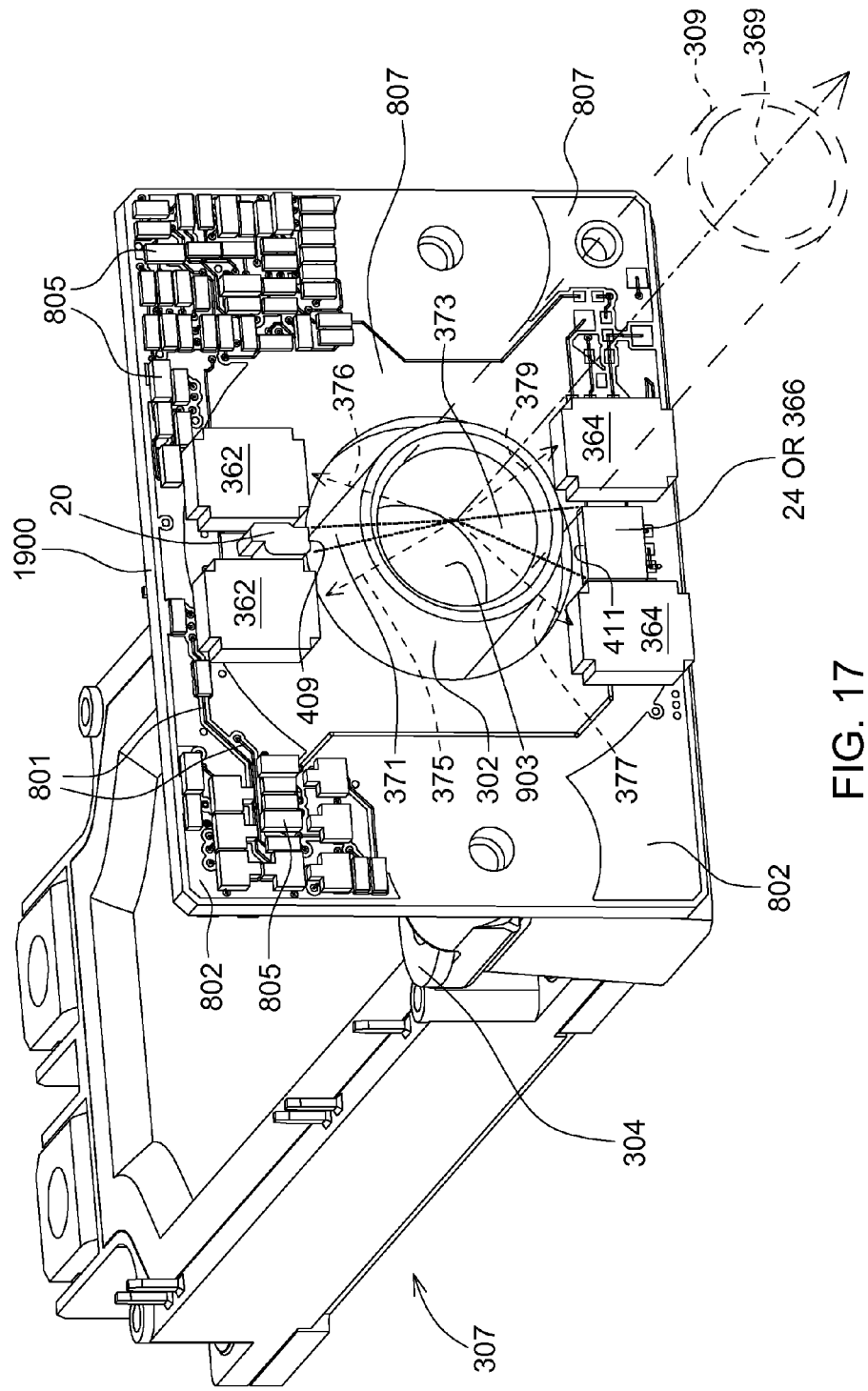
FIG. 17 is a block diagram of an embodiment of the current sensor for sensing current in a conductor, where the current sensor uses one or more ferrite members.

FIG. 17 illustrates one embodiment of a current sensor with one or more ferrite members. Like reference numbers in FIG. 17 and any other drawings in this disclosure indicate like elements.

In FIG. 17, the current sensor comprises a multi-layered substrate 1900 that forms an inductor 18 with a central opening, a magnetic field sensor 20, one or more ferrite members, filtering circuits and a sensor fusion circuit 30. Although the central opening 903 is illustrated as substantially circular, it may be rectangular, elliptical or have any other geometric shape. An inductor 18 is capable of sensing an alternating current signal component of an observed signal. The inductor 18 comprises a multi-layered substrate 1900, a plurality of conductive traces associated with different layers of the substrate, and one or more conductive vias for interconnecting the plurality of conductive traces. A central opening in the multi-layered substrate 1900 and the inductor 18 has a central axis, which is coextensive with the longitudinal axis of the mating portion 309 of the conductor when in electrical and mechanical contact with connector 302.

A magnetic field sensor 20 is adapted to sense a direct current signal component of the observed signal in a conductor associated with the current sensor. In certain embodiments, the magnetic field sensor 20 may comprise Hall sensor, a through-hole magnetic field sensor 20, or surface-mount integrated circuit. In another embodiment, the magnetic field sensor 20 may comprise a magnetic field sensor 20 with an integral or built-in temperature sensor for sensing both the current and temperature of the conductor with the observed signal. If the magnetic field sensor 20 comprises a surface mount device instead of a through-hole device, the surface mount field sensor may be less expensive than the through-hole device and the assembly and manufacturing costs of the current sensor of the disclosure may be reduced.

In an alternative embodiment, more than one magnetic field sensor 20 can be used. For example, the secondary sensor 366 may comprise a second magnetic field sensor. As previously noted, the magnetic field sensors (20, 366) can be of any package type including through-hole part, surface-mount leaded part, and surface-mount lead-less package part. A leadless package of magnetic field sensor (20, 366) facilitates a compact layout of the circuit on the substrate (1900) or circuit board (e.g., ceramic substrate). The compact layout avoids and mitigates the circuit interaction of one or more magnetic sensors (e.g., 20, 366) with one or more stray magnetic fields or electromagnetic fields. Further, the leadless surface-mount package of a magnetic sensor (e.g., 20, 366) is well-suited for dense population of the circuit board 1900 with ferrite members (362, 364) (working as a magnetic flux concentrator) leaving almost no spatial gap between magnetic sensor (20) and primary ferrite members (362), and/or magnetic sensor (366) and secondary ferrite members (364).

In one embodiment, a second sensor (24 or 366) may be located below the opening in the circuit board as show, or adjacent or proximate to the magnetic field sensor 20. The second sensor (24 or 366) may comprise a temperature sensor, a voltage detector for detecting an excess voltage, a current change sensor, or a voltage change sensor, or a diagnostic unit. For instance, the diagnostic unit may detect the presence of or estimate electromagnetic interference, electromagnetic coupling, current change versus time, and voltage change versus time that might degrade the performance of the current sensor or the magnetic field sensor 20, or indicate a fault condition. The second sensor (24 or 366) or temperature sensor can be located in proximity to the conductor with the observed signal to determine whether a short circuit or fault results in heating of the conductor. In certain embodiments, the second sensor (24 or 366) may comprise a surface mount device.

In one embodiment, the ferrite members may comprise ferrite beads, polygonal ferrite members, rectangular ferrite members that are capable of being mounted on a substrate or printed circuit board, such as the multi-layer printed circuit board. The ferrite members of FIG. 17 through 22, inclusive, can replace the larger ferrite member 958 of FIG. 10, for example. The ferrite members of FIG. 17 through FIG. 22, inclusive, take up less space on the surface of the circuit board than the larger ferrite member 958. Further, the ferrite members of FIG. 17 through FIG. 22, inclusive, require no special treatment for vibration and shock.

In an alternate embodiment, the ferrite members may comprise toroidal ferrite members or ferrite members of other shapes that are capable of being mounted on a substrate or printed circuit board.

As illustrated, one or more primary ferrite members 362 are spaced apart radially from the magnetic field sensor 20, with respect to the longitudinal axis 369 of the conductor, on opposite sides of the magnetic field sensor 20. One primary ferrite member 362 is positioned coincident with a first radial axis 375 with respect to the central axis or longitudinal axis 369 of the conductor, or its mating portion 309. Another primary ferrite member 362 is positioned coincident with a second radial axis 376 with respect to the central axis or longitudinal axis 369 of the conductor, or its mating portion 309. In one embodiment, the primary ferrite members 362 do not occupy a primary radial region 371 between the central axis (or longitudinal axis 369) and the magnetic field sensor 20.

The primary ferrite members 362 direct, concentrate or steer an orientation of a magnetic field (e.g., magnetic flux or peak magnetic field vector) of the observed signal toward a target area or bottom surface 409 of the magnetic field sensor 20. For example, the primary ferrite members 362 direct, concentrate or steer the orientation of the magnetic field of the observed signal within the primary radial area 371. The primary ferrite members 362 may direct the magnetic flux or orientation of the peak magnetic field perpendicular to the target area 409 or bottom surface of the magnetic field sensor 20.

By steering, directing or concentrating the magnetic field, the primary ferrite members 362 enhance the magnetic field sensitivity of the magnetic field sensor 20 or allow the magnetic field sensor 20 to use a greater extent of its magnetic field sensitivity by reducing an observed noise floor. For example, the ferrite members are well suited to facilitate reduced noise or greater immunity from one or more of the following: (a) change in current versus time noise (di/dt), (b) change in voltage versus time noise (di/dt), (c) electromagnetic interference, (d) electromagnetic coupling effects, and (e) stray magnetic fields from other conductors in the electronic module (e.g., inverter or controller) associated with the current sensor. The change in current versus time noise and the change in voltage versus time noise may be generated by the switching semiconductors of an inverter or motor controller that is used in conjunction with the current sensor or method of this disclosure. The electromagnetic interference, electromagnetic coupling effects and stray magnetic fields may originate from adjacent, proximate or nearby current carrying conductors, distinct from the conductor with the observed signal. Hence, the perceived sensitivity of the current sensor can be increased by using the ferrite members in accordance with this disclosure.

The magnitude of the magnetic field sensitivity of the magnetic field sensor 20 may be measured in mV/Gauss, for instance. In one configuration, if the magnetic field sensitivity of the magnetic field sensor 20 is increased, the magnetic field sensor 20 produces an increased magnitude of its output for the same observed magnetic field strength in the conductor.

In an alternate embodiment, a magnetic field sensor 20 with a lower sensitivity than otherwise possible may be used in conjunction with ferrite members.

As illustrated, one or more secondary ferrite members 364 are spaced apart radially from the secondary sensor (24 or 366), with respect to the longitudinal axis 369 of the conductor, on opposite sides of the secondary sensor (24 or 366). One secondary ferrite member 364 is positioned coincident with a third radial axis 377 with respect to the central axis or longitudinal axis 369 of the conductor, or its mating portion 309. Another secondary ferrite member 364 is positioned coincident with a fourth radial axis 379 with respect to the central axis or longitudinal axis 369 of the conductor, or its mating portion 309. In one embodiment, the secondary ferrite members 364 do not occupy a secondary radial region 373 between the central axis (or longitudinal axis 369) and the secondary sensor (24 or 366).

The secondary ferrite members 364 direct, concentrate or steer an orientation of a magnetic field (e.g., magnetic flux or peak magnetic field vector) of the observed signal toward a target area or top surface 411 of the secondary sensor (24 or 366). For example, the secondary ferrite members 364 direct, concentrate or steer the orientation of the magnetic field of the observed signal within the secondary radial area 373. The secondary ferrite members 364 may direct the magnetic flux, electromagnetic field or orientation of the peak magnetic field perpendicular to the target area 411 or top surface of the secondary sensor (24 or 366). For example, the magnetic field or electrical field may be oriented toward a target area of the current change sensor as the secondary sensor (24 or 366), where the magnetic field and the electrical field are generally mutually orthogonal to each other with respect to a direction of propagation for a given electromagnetic field.

By steering, directing or concentrating the magnetic field, the secondary ferrite members 364 enhance the magnetic or electrical field sensitivity of the secondary sensor (24 or 366) or allow the secondary sensor (24 or 366) to use a greater extent of its magnetic or electrical field sensitivity by reducing an observed noise floor. Accordingly, if the secondary sensor (24 or 366) comprises a current change sensor, a voltage change sensor, or an electromagnetic interference sensor the sensor may detect an electrical field, an electromagnetic field, or a magnetic field associated with the observed signal in the conductor. For example, the ferrite members are well suited to facilitate reduced noise or greater immunity from one or more of the following: (a) change in current versus time noise (di/dt), (b) change in voltage versus time noise (di/dt), (c) electromagnetic interference, (d) electromagnetic coupling effects, and (e) stray magnetic fields from other conductors in the electronic module (e.g., inverter or controller) associated with the current sensor. The change in current versus time noise and the change in voltage versus time noise may be generated by the switching semiconductors of an inverter or motor controller that is used in conjunction with the current sensor or method of this disclosure. The electromagnetic interference, electromagnetic coupling effects and stray magnetic fields may originate from adjacent, proximate or nearby current carrying conductors, distinct from the conductor with the observed signal. Hence, the perceived sensitivity of the secondary sensor (24 or 366) and the overall current sensor can be increased by using the ferrite members in accordance with this disclosure.

A first filtering circuit 26 has a high-pass filter response. The first filtering circuit 26 is coupled to the inductor 18 to provide a filtered alternating current signal component. The inductor 18, along with first filtering circuit 26, is used to measure the current change and also a higher frequency (e.g., at or above 1000 Hz) time varying current of any wave-shape, such as, sinusoidal, trapezoidal, square, or otherwise.

A second filtering circuit 28 has a low-pass filter response. The second filtering circuit 28 is coupled to the magnetic field sensor 20 to provide a filtered direct current signal component. The magnetic field sensors 20 along with associated electronic circuits are used to measure the current signal from 0.0 Hz (DC) to a lower frequency (e.g., about 1000 Hz or 1500 Hz) time varying current of any wave-shape, such as, sinusoidal, trapezoidal, square, or otherwise.

A sensor fusion circuit 30 is adapted to accept the filtered alternating current signal component and the filtered direct current signal component and to determine an aggregate sensed current.

In one embodiment of the current sensor of FIG. 17, the primary ferrite members 362 are grounded with one or more conductors (e.g., threaded through the primary ferrite members 362, wrapped around the primary ferrite members 362, or otherwise configured) to suppress electromagnetic interference with respect to the magnetic field sensor 20. Similarly, the secondary ferrite members 364 are grounded with one or more conductors (e.g., threaded through the secondary ferrite members 362, wrapped around the secondary ferrite members 362, or otherwise configured) to suppress electromagnetic interference with respect to the magnetic field sensor 20, the secondary sensor (24 or 366), or both.

In one configuration, the inductor 18 and the magnetic field sensor 20 are arranged to be proximate or near a conductor that connects an inverter output of an inverter to an electric motor. In an alternate embodiment, an optional temperature sensor is spaced apart from the conductor to estimate a temperature of the conductor.

Figure 18:
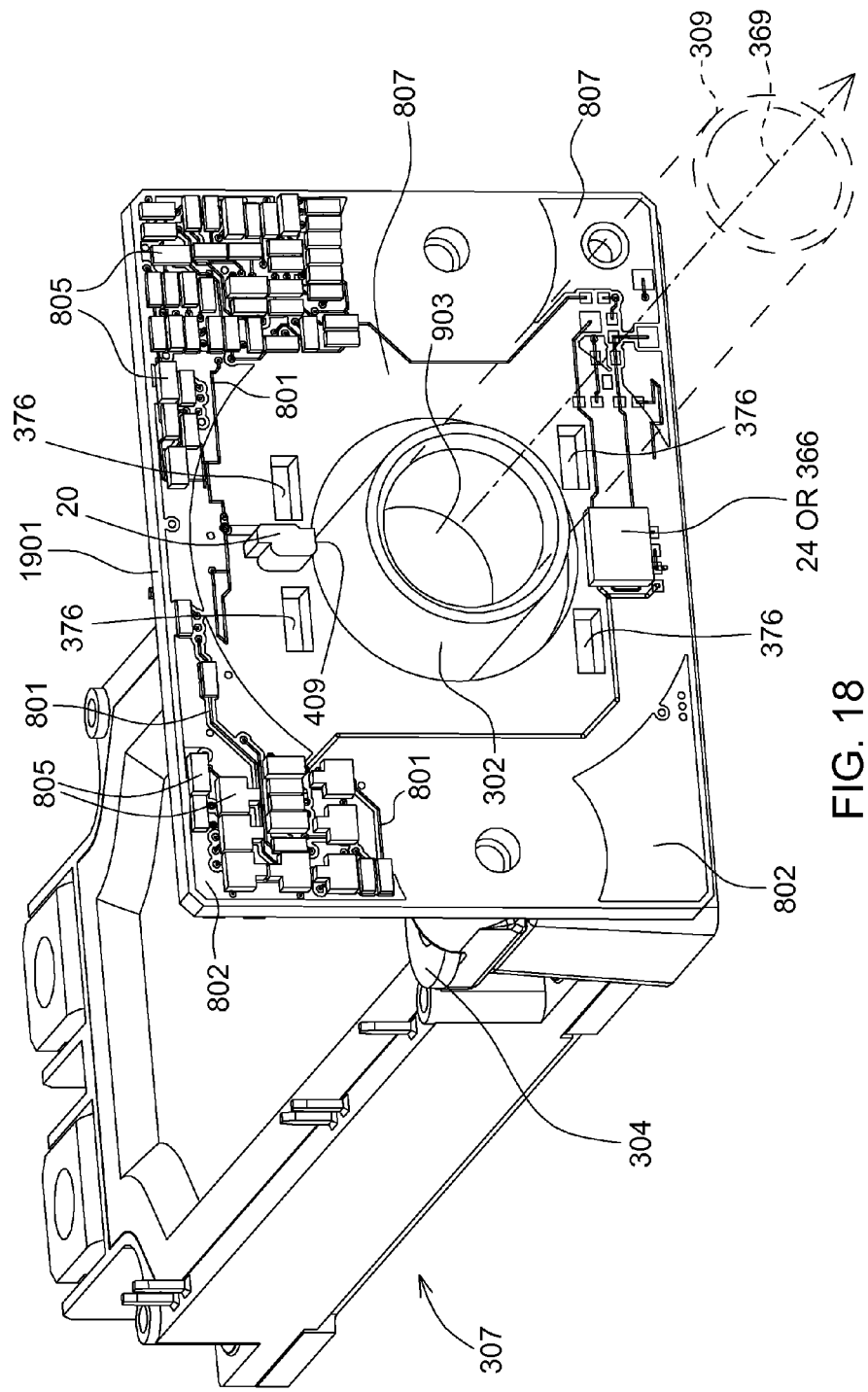
FIG. 18 is a block diagram of an embodiment of the current sensor for sensing current in a conductor, where the current sensor does not use one or more ferrite members.

FIG. 18 is similar to the current sensor of FIG. 17, except FIG. 18 deletes the ferrite members (362, 364) and designates the multi-layered substrate 1901 without the ferrite members (362, 364). Although the multi-layered substrate 1901 provides illustrated examples of through-holes 376 for mounting the ferrite members (362, 364), other embodiments that fall within the scope of the claims do not require any through-holes for mounting the ferrite members (362, 364). Like reference numbers in FIG. 17 and FIG. 18, and in any other drawings, indicate like elements. The current sensor of FIG. 18 may be used in conjunction with a metal shield 378 as shown in FIG. 19 or FIG. 20, for example.

Figure 19:
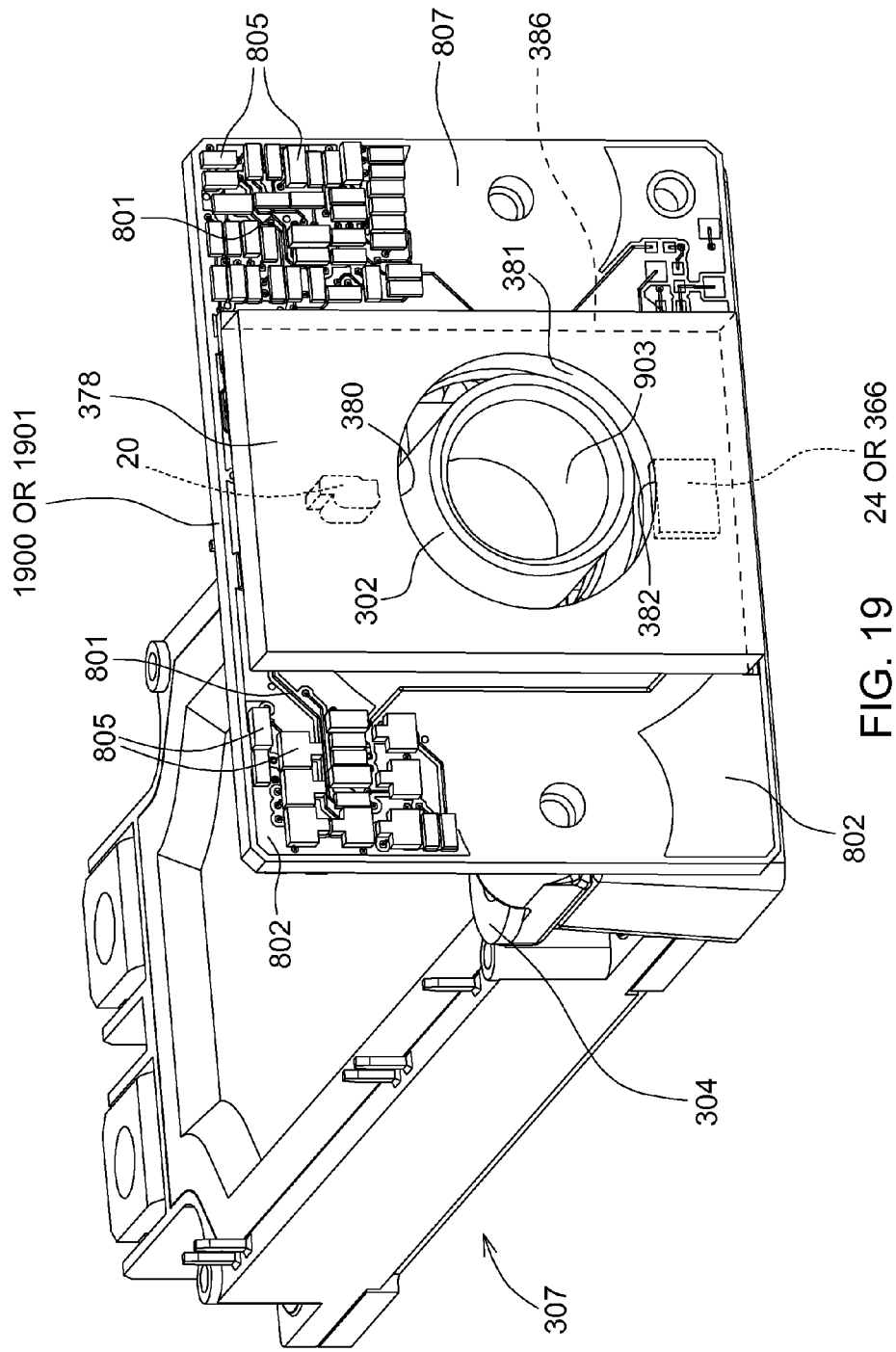
FIG. 19 is a block diagram of an embodiment of the current sensor for sensing current in a conductor, where the current sensor uses a metal shield 378.
Figure 20:
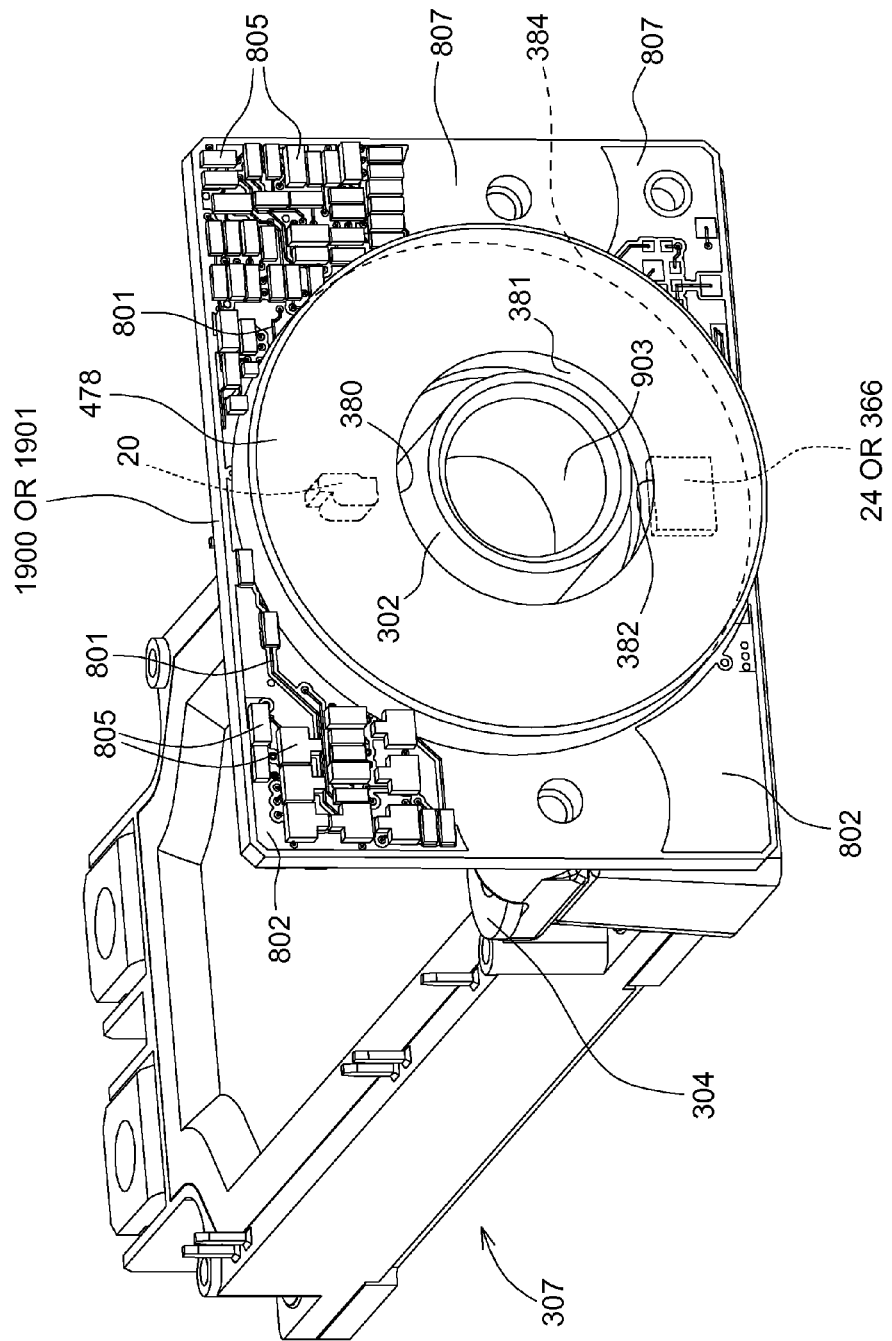
FIG. 20 is a block diagram of an embodiment of the current sensor for sensing current in a conductor, where the current sensor uses a metal shield 378.

FIG. 19 is similar to the current sensor of FIG. 17 or FIG. 18, except FIG. 19 adds a metal or metallic shield. Like reference numbers in FIG. 17 through 19, inclusive, or in any other drawings, indicate like elements.

In FIG. 19, the metal shield 378 or metallic shield comprises a generally rectangular hollow body with a cylindrical portion 381 about a central axis (or longitudinal axis 369) and a perimeter 386. The cylindrical portion 381 may contain a primary opening 380 and a secondary opening 382, where the primary opening 381 is aligned with the primary radial region 371 (or a target area 409 of the magnetic field sensor 20) and wherein the secondary opening 382 is aligned with the secondary radial region 373 (or a target area 411 of the secondary sensor (24 or 366)). The perimeter may comprise one or more perimeter walls 381.

In one embodiment, the metal shield 378 is stamped, formed, welded, cast or otherwise constructed from steel or a ferromagnetic alloy. In another embodiment, the metal shield 378 may be formed as a metal screen or an insulting screen with conductive metallic particles adhesively bonded thereto. In yet another embodiment, the metal or metallic shield is formed of metallic particles bound in a polymer matrix, plastic matrix, or resin. In one embodiment, the magnetic shield is mounted to a side of the multi-layered substrate (1900 or 1901), the hollow body comprising a recess to receive and cover any components mounted on the side of the multi-layered substrate (1900 or 1901).

In one configuration, a metal shield 378 or metallic shield has a recess for enclosing at least an annular region (e.g., a region with a substantially circular inner boundary and a substantially circular, elliptical curved, or rectangular outer boundary or perimeter) extending outward around the opening and covers the magnetic field sensor 20 to reduce, attenuate or minimize one or more stray magnetic fields not associated with the observed signal in the conductor. In FIG. 19, the magnetic field sensor 20 and the secondary sensor (24 or 366) are shown in phantom with dashed lines because they underneath the metal shield 378. The outer perimeter 386 of the metal shield metallic shield may terminate in a substantially rectangular, substantially polygonal, or substantially rectilinear outer boundary. The metal shield 378 is well suited for improving the current sensor's and the magnetic field sensor's immunity to one or more of the following: electromagnetic noise, electromagnetic interference, and stray magnetic fields, for example.

A metal shield 378 or metallic shield encloses an annular region extending outward around the opening and covers the current change sensor. In one embodiment, the metal shield 378 has a primary opening 380, in an inner cylindrical surface 381, facing the magnetic field sensor 20 and the primary radial region 371; the metal shield 378 and a secondary opening 382, in the inner cylindrical surface 381, facing the secondary sensor or current change sensor and the secondary radial region 373. For example, the inner cylindrical surface 381 comprises a substantially cylindrical surface or an interior surface with the primary opening 380 for receiving a steered, directed or otherwise concentrated magnetic field, where the concentrated magnetic field is associated with the observed signal and emanates (e.g., radiates) from the conductor toward the target area of the magnetic field sensor 20. The metal shield 378 has a primary opening 380 facing the magnetic field sensor 20 in the primary radial region 371 facing the magnetic field sensor 20 to reduce one or more stray magnetic fields not associated with the observed signal, while allowing the observed signal to be measured by the magnetic field sensor 20.

At one or more points of the perimeter 386 or continuously along the perimeter 386, the perimeter 386 of metal shield 378 is grounded to ensure that shield body remains substantially at ground potential. The ground ensures that the metal shield 378 doesn't develop any appreciable voltage on it as compared to system (inverter) ground, chassis ground, vehicle ground or vehicle battery ground. For the magnetic sensor 20 to be free from any material stray magnetic fields produced by the conductors for other phases of inverter, a metal shield 378 is placed over the magnetic sensor 20 or magnetic sensors 20 with a hole in the metal shield 378 for the current conductor pass through.

In one configuration of FIG. 19, consistent with the embodiment of FIG. 17 where ferrite members (362, 364) are mounted on the multi-layered substrate (1900 or 1901), the metal shield 378 comprises a generally hollow body mounted to a side of the multi-layered substrate (1900 or 1901) to form a recess to receive and cover the magnetic sensor 20, the secondary sensor (24 or 366), the primary ferrite members 362 and the secondary ferrite members 364 mounted on the side 807 of the multi-layered substrate 1900 of FIG. 17. In one embodiment, the metal shield 378 extends outward around the central opening 903 and covers the magnetic field sensor 20 and primary ferrite members 362. Similarly, the metal shield 378 extends outward around the central opening 903 and covers the secondary sensor (24 or 366) and secondary ferrite members 364.

In another configuration of FIG. 19, consistent with the embodiment of FIG. 18 where ferrite members (362, 364) are not mounted on the multi-layered substrate 1901, the metal shield 378 comprises a generally hollow body mounted to a side of the multi-layered substrate 1901 to form a barrier to stray magnetic fields from other sources that might otherwise interfere with the electrical field, magnetic field or electromagnetic field, sensed or attempted to be sensed by the magnetic field sensor 20, the secondary sensor (24 or 366), or both.

FIG. 20 is similar to the current sensor of FIG. 17 or FIG. 18, except FIG. 20 adds a metal shield 478. Like reference numbers indicate like elements in FIG. 17 through FIG. 20, inclusive an in any other drawings presented in this disclosure.

The metal shield 478 or metallic shield encloses an annular region extending outward around the opening and covers the magnetic field sensor 20 and the secondary sensor (24 or 366). In FIG. 20, the magnetic field sensor 20 and the secondary sensor (24 or 366) are shown in phantom with dashed lines because they underneath the metal shield 478. The metal shield 478 or metallic shield comprises a generally cylindrical, curved, circular or elliptical hollow body with a cylindrical portion 381 about a central axis (or longitudinal axis 369) and a perimeter 386. The cylindrical portion 381 may contain a primary opening 380 and a secondary opening 382, where the primary opening 381 is aligned with the primary radial region 371 (or a target area 409 of the magnetic field sensor 20) and wherein the secondary opening 382 is aligned with the secondary radial region 373 (or a target area 411 of the secondary sensor (24 or 366)). In one embodiment, the metallic shield has a first opening, in an inner cylindrical surface, facing the magnetic field sensor 20 and a second opening, in the inner cylindrical surface, facing the current change sensor in secondary radial region 373.

The perimeter may comprise a perimeter wall 384 or perimeter boundary. In FIG. 20, the outer perimeter wall 384 of the metal shield or metallic shield may terminate in a substantially cylindrical, curved, circular, or elliptical outer boundary.

In one embodiment, the metal shield 478 is stamped, formed, welded, cast or otherwise constructed from steel or a ferromagnetic alloy. In another embodiment, the metal shield 478 may be formed as a metal screen or an insulting screen with conductive metallic particles adhesively bonded thereto. In yet another embodiment, the metal shield 478 or metallic shield is formed of metallic particles bound in a polymer matrix, plastic matrix, or resin. The metal shield 478 has a first opening facing the magnetic field sensor 20 in the primary radial region 371 facing the magnetic field sensor 20 to reduce one or more stray magnetic fields not associated with the observed signal, while allowing the observed signal to be measured by the magnetic field sensor 20.

In one configuration of FIG. 20, consistent with the embodiment of FIG. 17 where ferrite members (362, 364) are mounted on the multi-layered substrate 1900, the metal shield 478 comprises a generally annular hollow body; the generally annular hollow body is mounted to a side 807 of the multi-layered substrate 1900 to form a recess to receive and cover the magnetic field sensor 20, the secondary sensor (24 or 366), the primary ferrite members 262 and the secondary ferrite members 264 mounted on the side 807 of the multi-layered substrate 1900.

In another configuration of FIG. 20, consistent with the embodiment of FIG. 18 where ferrite members (362, 364) are not mounted on the multi-layered substrate 1901, the metal shield 478 comprises a generally annular hollow body; the generally annular hollow body is mounted to a side 807 of the multi-layered substrate 1901 to form a barrier to stray electrical fields, magnetic fields, or electromagnetic fields from other sources that might otherwise interfere with magnetic field sensed or attempted to be sensed by the magnetic field sensor 20, the secondary sensor (24 or 366), or both.

Figure 21:
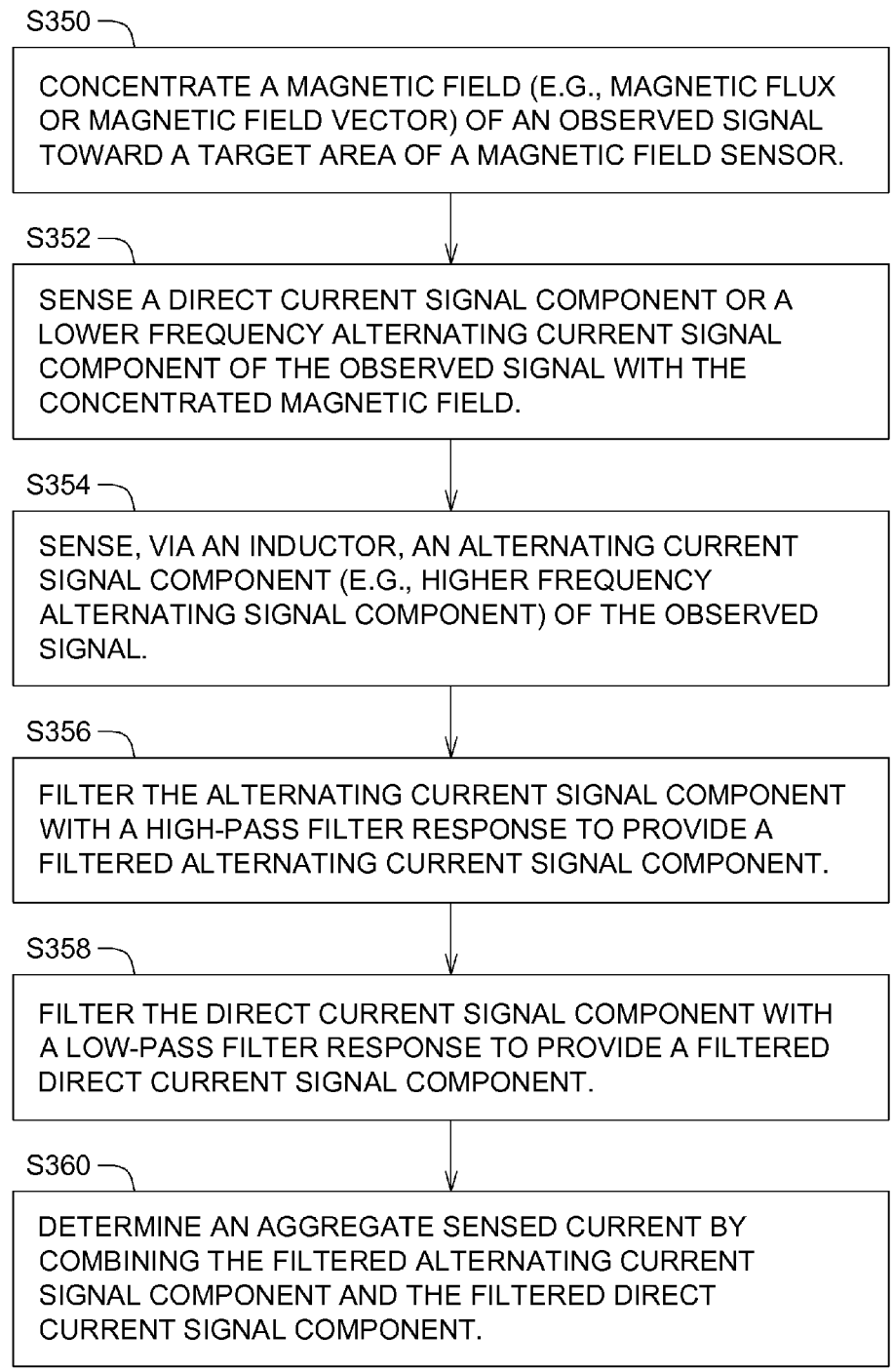
FIG. 21 is a flow chart of one example of a method for sensing current in a conductor consistent with any of the embodiments of the current sensors illustrated in FIG. 17. through FIG. 20, inclusive.

The method of FIG. 21 starts in step S350.

In step S350, one or more ferrite members (362, 364) concentrate a magnetic field (e.g., magnetic flux or magnetic field vector) of an observed signal toward a target area 409 of a magnetic field sensor 20. For example, ferrite members (362, 364) and a magnetic field sensor 20 are mounted on a circuit board 1900 in a plane that is substantially perpendicular to a longitudinal axis 369 of a conductor (309) conducting a signal to be measured, where the ferrite members (362, 364) are spaced apart radially from opposite sides of the magnetic field sensor 20. The magnetic field sensor 20 may have a target area 409 that is more sensitive to detection and measurement of a sensed magnetic field than other portions of the magnetic field sensor 20.

In an alternate procedure for step S350, one or more primary ferrite members 362 concentrate a magnetic field (e.g., magnetic flux or magnetic field vector) of an observed signal toward a target area 409 of a magnetic field sensor 20; one or more secondary ferrite members 364 concentrate an electromagnetic, electrical or magnetic field (e.g., magnetic flux or magnetic field vector) of an observed signal toward a target area 411 of a secondary sensor (24 or 366.) Further, the secondary sensor 24 may provide input to the first filtering circuit 26 as previously discussed in FIG. 1, for example.

In step S352, a magnetic field sensor 20 senses a direct current signal component or a lower frequency alternating current signal component of the observed signal with the concentrated magnetic field. For instance, the concentrated magnetic field was directed, steered or concentrated in accordance with step S350 such that the magnetic field impinges upon or intercepts a target area 409 of the magnetic field sensor 20.

In step S354, an inductor 18 senses an alternating current signal component (e.g., higher frequency alternating signal component) of the observed signal. In one embodiment, the inductor 18 comprises a substrate, conductive traces associated with different layers of the substrate, and one or more conductive vias for interconnecting the plurality of conductive traces.

In step S356, a first filtering circuit 26 filters the alternating current signal component with a high-pass filter response to provide a filtered alternating current signal component.

In step S358, a second filtering circuit 28 filters the direct current signal component (or the low frequency alternating current signal component) with a low pass filter response to provide a filtered direct current signal component.

In step S360, sensor fusion circuit 30 determines an aggregate sensed current by combining the filtered alternating current signal component and the filtered direct current signal component.

Figure 22:
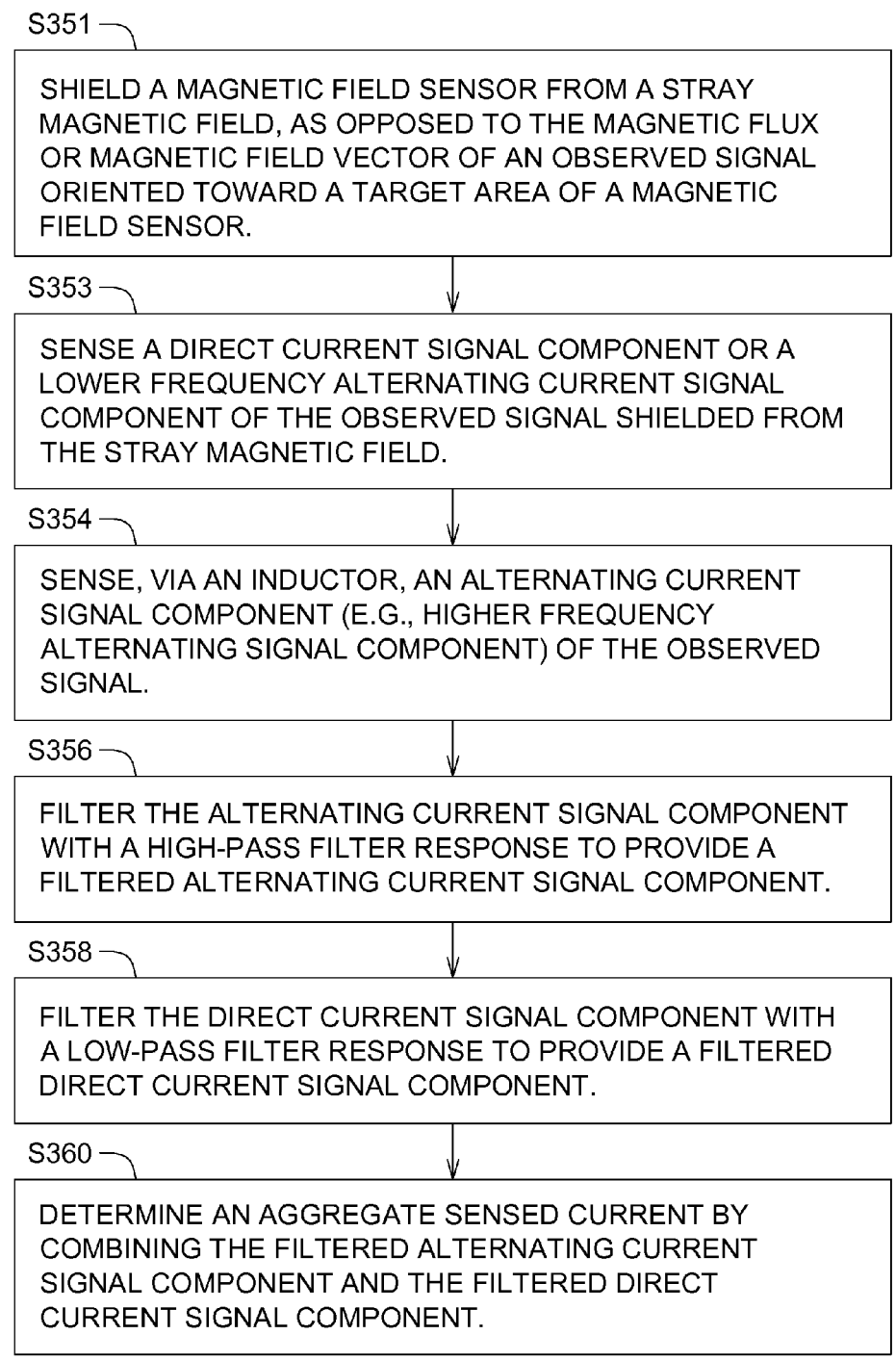
FIG. 22 is a flow chart of another example of a method for sensing current in a conductor consistent with any of the embodiments of the current sensors illustrated in FIG. 17. through FIG. 20, inclusive.

The method of FIG. 22 starts in step S351. Like reference numbers in FIG. 21 and FIG. 22 indicate like steps or procedures.

In step S351, a metal shield (378 or 478) or metallic shield shields a magnetic field sensor 20 or its target area (409) from stray magnetic field. The stray magnetic field is not the desired magnetic field associated with the signal to be measured in the conductor, or its mating portion 309. In one embodiment, the desired magnetic field is oriented such that the magnetic flux or magnetic field vector of the observed signal is oriented toward the target area of the magnetic field sensor 20. For example, metal shield (378 or 478) and a magnetic field sensor 20 are mounted on a circuit board (1900 or 1901) in a plane that is substantially perpendicular to a longitudinal axis 369 of a conductor conducting a signal to be measured, where metal shield (378 or 478) covers or surrounds the magnetic field sensor 20, except for an opening (e.g., primary opening 380) for receiving a radially oriented magnetic field from the signal to be measured in the conductor. The primary opening 380 in the cylindrical surface 381 of the metal shield (378 or 478) may be aligned with the target area 409 of the magnetic field sensor 20. The magnetic field sensor 20 may have a target area 409 that is more sensitive to detection and measurement of a sensed magnetic field than other portions of the magnetic field sensor 20.

In step S353, a magnetic field sensor 20 senses a direct current signal component or a lower frequency alternating current signal component of the observed signal that is shielded from the stray magnetic field (e.g., in step S351).

Step S353 may be carried out in accordance with various techniques that may be applied alternately or cumulatively. Under the first technique, the magnetic field sensor 20 senses a direct current signal component or a lower frequency alternating current signal component of the observed signal that is shielded from the stray magnetic field by a metal shield (378 or 478).

Under a second technique, the magnetic field sensor 20 senses a direct current signal component or a lower frequency alternating current signal component of the observed signal that is shielded from the stray magnetic field by a metal shield (378 or 478); where the metal shield comprises a cylindrical inner surface 381 with a primary opening 380 for receiving the magnetic field associated with the observed signal that emanates or radiates from the conductor or its mating portion (309).

Under a third technique, a magnetic field sensor 20 senses a direct current signal component or a lower frequency alternating current signal component of the observed signal with a steered or concentrated magnetic field. For instance, the concentrated magnetic field was directed, steered or concentrated in accordance with step S350 of FIG. 21 such that the magnetic field impinges upon or intercepts a target area 409 of the magnetic field sensor 20.

In step S354, an inductor 18 senses an alternating current signal component (e.g., higher frequency alternating signal component) of the observed signal. In one embodiment, the inductor comprises a substrate, conductive traces associated with different layers of the substrate, and one or more conductive vias for interconnecting the plurality of conductive traces.

In step S356, a first filtering circuit 26 filters the alternating current signal component with a high-pass filter response to provide a filtered alternating current signal component.

In step S358, a second filtering circuit 28 filters the direct current signal component (or direct current signal component and the low frequency alternating current signal component) with a low pass filter response to provide a filtered direct current signal component.

In step S360, sensor fusion circuit 30 determines an aggregate sensed current by combining the filtered alternating current signal component and the filtered direct current signal component.

Having described one or more embodiments in this disclosure, it will become apparent that various modifications can be made without departing from the scope of the invention as defined in the accompanying claims. For example, one or more of any dependent claims set forth in this document may be combined with any independent claim to form any combination of features set forth in the appended claims, and such combination of features in the claims are hereby incorporated by reference into the specification of this document.

The invention claimed is:

1. A current sensor comprising:
    an inductor for sensing an alternating current signal component of an observed signal;
    a central opening in the multi-layered substrate having a central axis;
    a magnetic field sensor for sensing a direct current signal component of the observed signal;
    a plurality of primary ferrite members spaced apart from the magnetic field sensor on opposite sides of the magnetic field sensor to concentrate or steer an orientation of a magnetic field of the observed signal toward a target area of the magnetic field sensor;
    a first filtering circuit having a high-pass filter response, the first filtering circuit coupled to the inductor to provide a filtered alternating current signal component;
    a second filtering circuit having a low-pass filter response, the second filtering circuit coupled to the magnetic field sensor to provide a filtered direct current signal component; and
    a sensor fusion circuit for accepting the filtered alternating current signal component and the filtered direct current signal component and for determining an aggregate sensed current.

2. The current sensor according to claim 1 wherein the primary ferrite members are grounded to suppress electromagnetic interference with respect to the magnetic field sensor.

3. The current sensor according to claim 1 further comprising:
    a conductor, wherein the inductor and the magnetic field sensor are arranged to be proximate or near the conductor that connects an inverter output of an inverter to an electric motor.

4. The current sensor according to claim 1 further comprising:
    a metal shield extending outward around the central opening and covering the magnetic field sensor and the primary ferrite members.

5. The current sensor according to claim 4 wherein the metal shield comprises a substantially cylindrical portion with a primary opening for receiving the concentrated magnetic field, associated with the observed signal and emanating from a conductor, toward the target area of the magnetic field sensor.

6. The current sensor according to claim 1 further comprising:
    a conductor, wherein the inductor and the magnetic field sensor are arranged to be proximate or near the conductor that connects an inverter output of an inverter to an electric motor; and
    a current change sensor spaced apart from the conductor to estimate a change in current in the conductor.

7. The current sensor according to claim 6 further comprising:
a plurality of secondary ferrite members spaced apart from the current change sensor on opposite sides of the current change sensor, the secondary ferrite members directing or concentrating an electromagnetic field within a secondary radial region between the central axis and the current change sensor and toward a target area of the current change sensor.

8. The current sensor according to claim 7 further comprising a metal shield extending outward around the central opening and covering the current change sensor and the secondary ferrite members.

9. The current sensor according to claim 8 wherein the metal shield comprises a substantially cylindrical portion with a secondary opening facing the target area of the current change sensor for receiving an electromagnetic field, associated with the observed signal and emanating from a conductor.

10. The current sensor according to claim 7 wherein the secondary ferrite members are grounded to suppress electromagnetic interference with respect to the current change sensor.

11. The current sensor according to claim 1 wherein a metallic shield encloses an annular region extending outward around the opening and covers the magnetic field sensor to reduce one or more stray magnetic fields not associated with the observed signal.

12. The current sensor according to claim 1 wherein the metallic shield comprises a first opening, in a primary radial region, facing a target area of the magnetic field sensor to reduce one or more stray magnetic fields not associated with the observed signal.

13. The current sensor according to claim 1 wherein the magnetic shield comprises a generally annular hollow body that is mounted to a side of the multi-layered substrate, the hollow body comprising a recess to receive and cover the magnetic field sensor and the primary ferrite members mounted on the side of the multi-layered substrate.

14. The current sensor according to claim 1 wherein the magnetic shield comprises a generally rectangular hollow body with a cylindrical portion about a central axis, where the magnetic shield is mounted to a side of the multi-layered substrate, the hollow body comprising a recess to receive and cover the magnetic field sensor and the primary ferrite members mounted on the side of the multi-layered substrate.

15. The current sensor according to claim 1 wherein the inductor comprising a multi-layered substrate, a plurality of conductive traces associated with different layers of the substrate, and one or more conductive vias for interconnecting the plurality of conductive traces.

16. A method for sensing current, the method comprising:
directing or concentrating, via one or more ferrite members, a magnetic field of an observed signal in a conductor toward a target area of a magnetic field sensor;
sensing a direct current signal component of the observed signal with the concentrated magnetic field;
sensing, via an inductor, an alternating current signal component of an observed signal;
filtering the alternate current signal component with a high-pass filter response to provide a filtered alternating current signal component;
filtering the direct current signal component with a low pass filter response to provide a filtered direct current signal component; and
determining an aggregate sensed current by combining the filtered alternating current signal component and the filtered direct current signal component.

17. The method according to claim 16 wherein the directing is accomplished by positioning the ferrite members radially spaced apart from the magnetic field sensor mounted on a circuit board or substrate.

18. The method according to claim 16 wherein the circuit board is mounted substantially perpendicular to a longitudinal axis of a conductor with the observed signal to be measured.

19. The method according to claim 16 wherein during the directing the observed magnetic field is directed toward a target area of the magnetic field sensor through an opening in a metal shield that covers the magnetic field sensor and ferrite members.

20. A method for sensing current, the method comprising:
shielding, via a metal shield or metallic shield, a magnetic field sensor from a stray magnetic field to allow the magnetic field sensor to detect an observed signal in a conductor at a target area of a magnetic field sensor;
sensing a direct current signal component of the observed signal with the concentrated magnetic field;
sensing, via an inductor, an alternating current signal component of an observed signal;
filtering the alternate current signal component with a high-pass filter response to provide a filtered alternating current signal component;
filtering the direct current signal component with a low pass filter response to provide a filtered direct current signal component; and
determining an aggregate sensed current by combining the filtered alternating current signal component and the filtered direct current signal component.

21. The method according to claim 20 wherein during the shielding the observed magnetic field is directed toward a target area of the magnetic field sensor through an opening in a metal shield that covers the magnetic field sensor.

22. The method according to claim 20 wherein the metal shield is mounted on a printed circuit board or substrate to cover the magnetic field sensor and wherein the printed circuit board or substrate is substantially perpendicular to a longitudinal axis of the conductor.

23. The method according to claim 20 further comprising:
directing or concentrating, via one or more ferrite members, a magnetic field of an observed signal in a conductor toward a target area of a magnetic field sensor.

24. The method according to claim 23 wherein the directing is accomplished by positioning the ferrite members radially spaced apart from the magnetic field sensor mounted on a circuit board or substrate.

* * * * *